US012588226B2

(12) United States Patent
Lee

(10) Patent No.: US 12,588,226 B2
(45) Date of Patent: *Mar. 24, 2026

(54) INTEGRATED ASSEMBLIES AND METHODS FORMING INTEGRATED ASSEMBLIES

(71) Applicant: Micron Technology, Inc., Boise, ID (US)

(72) Inventor: Che-Chi Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 470 days.

This patent is subject to a terminal disclaimer.

(21) Appl. No.: 18/102,661

(22) Filed: Jan. 27, 2023

(65) Prior Publication Data

US 2023/0178586 A1     Jun. 8, 2023

Related U.S. Application Data

(62) Division of application No. 17/236,589, filed on Apr. 21, 2021, now Pat. No. 11,616,119.

(51) Int. Cl.
H10D 1/68 (2025.01)
H10B 12/00 (2023.01)
H10D 1/00 (2025.01)

(52) U.S. Cl.
CPC ........... H10D 1/696 (2025.01); H10B 12/033 (2023.02); H10B 12/0335 (2023.02); H10B 12/315 (2023.02); H10D 1/043 (2025.01); H10D 1/714 (2025.01); H10D 1/716 (2025.01)

(58) Field of Classification Search
CPC ........ H10D 1/043; H10D 1/714; H10D 1/716; H10B 41/20; H10B 43/20; H10B 12/315; H10B 12/033
See application file for complete search history.

(56) References Cited

U.S. PATENT DOCUMENTS

| | | | |
|---|---|---|---|
| 10,607,995 B2 | 3/2020 | Roberts et al. | |
| 10,825,815 B2 | 11/2020 | Tang et al. | |
| 11,257,821 B1 | 2/2022 | Lee | |
| 11,282,548 B1 * | 3/2022 | Lee ........................ | G11C 11/405 |
| 11,289,491 B1 | 3/2022 | Saeedi Vahdat et al. | |
| 11,295,786 B2 | 4/2022 | Kang et al. | |
| 11,367,726 B2 | 6/2022 | Lee et al. | |
| 11,393,820 B2 | 7/2022 | Lee et al. | |
| 11,915,777 B2 * | 2/2024 | Lee ........................ | H10D 1/692 |
| 12,127,396 B2 * | 10/2024 | Song ...................... | H10B 12/03 |
| 2019/0164985 A1 | 5/2019 | Lee et al. | |
| 2020/0043941 A1 * | 2/2020 | Kim ....................... | H10B 43/40 |

* cited by examiner

*Primary Examiner* — Jose R Diaz
(74) *Attorney, Agent, or Firm* — Wells St. John P.S.

(57) ABSTRACT

Some embodiments include an integrated assembly having a laterally-extending container-shaped first capacitor electrode, and having a laterally-extending container-shaped second capacitor electrode laterally offset from the first capacitor electrode. Capacitor dielectric material lines interior surfaces and exterior surfaces of the container-shaped first and second capacitor electrodes. A shared capacitor electrode extends vertically between the first and second capacitor electrodes, and extends along the lined interior and exterior surfaces of the first and second capacitor electrodes. Some embodiments include methods of forming integrated assemblies.

19 Claims, 50 Drawing Sheets

1200

1216

1214

1250

1214

1206

1208

1210

1210

1208

1212

10

21

A

B

B

A

25

10

A

28

25

33

25

B

B

A

10

A

28

25

33

25

B

B

A

10

A

28

25

33

25

B

B

A

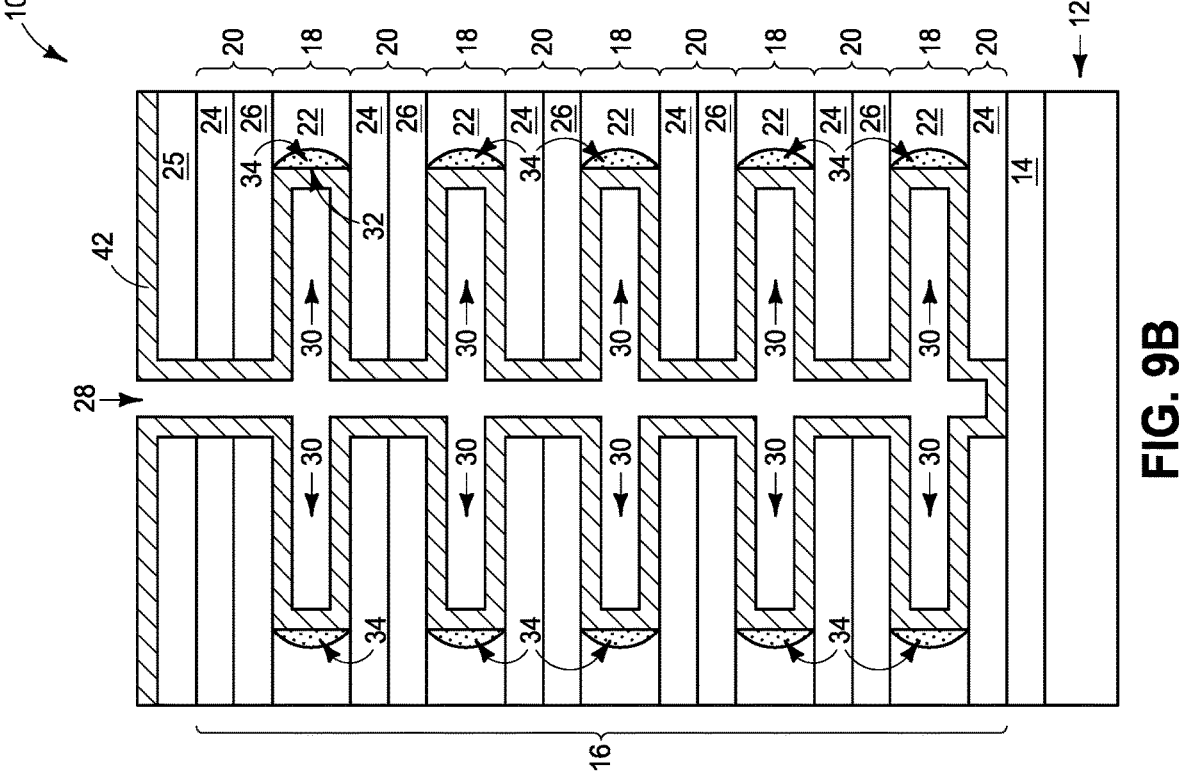
FIG. 9B
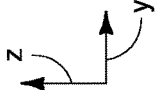

46

10

A

28

B ←------------------------------ B 25 46 25

A

10

A

28

52

24

A

B

52

24

B

1

INTEGRATED ASSEMBLIES AND METHODS FORMING INTEGRATED ASSEMBLIES

RELATED PATENT DATA

This patent is a divisional of and claims priority to U.S. patent application Ser. No. 17/236,589, filed Apr. 21, 2021, the disclosures of which are incorporated herein by reference.

TECHNICAL FIELD

Integrated assemblies (e.g., integrated memory). Methods of forming integrated assemblies.

BACKGROUND

Integrated assemblies may include memory. An example memory configuration 1200 is shown in FIG. 1. Transistors (access devices) 1206 include horizontally-extending segments of semiconductor material 1204, with such segments including source/drain regions 1238 and 1240, and including channel regions 1242. Capacitors 1208 are coupled with the transistors 1206 through conductive interconnects 1244. In some applications, the conductive interconnects may be considered to be part of the capacitors, and may, for example, be considered to be part of the storage nodes of such capacitors.

Memory cells 1210 comprise the transistors 1206 and the capacitors 1208. The memory cells are arranged within the memory configuration (memory array) 1200, with such array having rows 1224 extending along an illustrated z-axis direction, and having columns 1246 extending along an illustrated x-axis direction. Digit lines 1212 extend along the columns 1246, and are coupled with the source/drain regions 1238 of the transistors 1206. Wordlines 1214 extend along the rows 1224 of the memory array, and are adjacent to the channel regions 1242 of the transistors 1206. In the illustrated embodiment, each of the wordlines comprises two segments, with such segments being on opposing sides of the channel regions 1242. In other embodiments, the wordlines may comprise other suitable configurations, and may, for example, comprise only a single component on one side of a channel region, may comprise gate-all-around configurations, etc.

The wordlines 1214 are generally spaced from the channel regions 1242 by gate dielectric material (e.g., silicon dioxide), but such gate dielectric material is not shown in FIG. 1 in order to simplify the drawing.

The body regions (channel regions) 1242 of the transistors 1206 are coupled with a conductive plate 1248. Such plate may be utilized to enable excess carriers (e.g., holes) to drain from the body regions 1242 during some operational modes of the memory cells 1210.

FIG. 2 shows a cross-sectional side view of the assembly 1200 of FIG. 1 along the y-axis direction, and diagrammatically illustrates some of the structures described above with reference to FIG. 1. The transistors 1206 are shown to extend horizontally along the y-axis direction. The wordlines 1214 are shown to extend vertically along the z-axis direction, and the digit lines 1212 are shown to extend horizontally in and out of the page relative to the cross-sectional view of FIG. 2. The conductive plates 1248 (FIG. 1) are not shown in FIG. 2 in order to simplify the drawing.

The capacitors 1208 of laterally neighboring memory cells 1210 are shown to share a plate electrode 1250 in the memory configuration 1200 of FIG. 2.

A base 1216 supports components of the memory configuration 1200. Such base may comprise semiconductor material; and may, for example, comprise, consist essentially of, or consist of monocrystalline silicon. The base 1216 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 1216 may correspond to a semiconductor substrate containing one or more materials associated with integrated circuit fabrication. Such materials may include, for example, one or more of refractory metal materials, barrier materials, diffusion materials, insulator materials, etc.

Another example memory configuration 1300 is shown in FIG. 3. Transistors (access devices) 1306 include horizontally-extending segments of semiconductor material 1304, with such segments including source/drain regions 1338 and 1340, and including channel regions 1342. Capacitors 1308 are coupled with the transistors 1306 through conductive interconnects 1344. In some applications, the conductive interconnects may be considered to be part of the capacitors, and may, for example, be considered to be part of the storage nodes of such capacitors.

Memory cells 1310 comprise the transistors 1306 and the capacitors 1308. The memory cells are arranged within the memory configuration (memory array) 1300. Digit lines 1312 extend along columns of the memory array and are coupled with the source/drain regions 1338 of the transistors 1306. The digit lines extend vertically along a z-axis direction.

Wordlines 1314 extend along the rows of the memory array, and are adjacent to the channel regions 1342 of the transistors 1306. The wordlines 1314 are spaced from channel regions 1342 by gate dielectric material 1305.

The body regions (channel regions) 1342 of the transistors 1306 are coupled with a conductive plate 1348. Such plate may be utilized to enable excess carriers (e.g., holes) to drain from the body regions 1342 during some operational modes of the memory cells 1310.

FIG. 4 shows a cross-sectional side view of the assembly 1300 of FIG. 3 along the x-axis direction, and diagrammatically illustrates some of the structures described above with reference to FIG. 3. The transistors 1306 are shown to extend horizontally along the x-axis direction. The digit lines 1312 are shown to extend vertically along the z-axis direction, and the wordlines 1314 are shown to extend horizontally in and out of the page relative to the cross-sectional view of FIG. 4.

The capacitors 1308 of laterally neighboring memory cells 1310 are shown to share a plate electrode 1350.

The illustrated components of the memory configuration 1300 are shown to be supported by a base 1316. Such base may be a semiconductor substrate.

The memory shown in FIGS. 1-4 utilizes laterally-extending capacitors coupled with source/drain regions of access devices. It is desired to develop improved laterally-extending capacitors, and it is desired to develop methods of forming the improved laterally-extending capacitors.

BRIEF DESCRIPTION OF THE DRAWINGS

FIG. 5 is a diagrammatic top-down view, and FIGS. 5A and 5B are diagrammatic cross-sectional side views along the lines A-A and B-B of FIG. 5, respectively.

FIG. 6 is a diagrammatic top-down view of an upper surface of the assembly, and FIGS. 6A and 6B are diagrammatic cross-sectional side views along the lines A-A and B-B of FIG. 6, respectively. The top-down view of FIG. 6 does not show materials beneath the illustrated upper surface in order to simplify the drawing.

FIG. 7 is a diagrammatic top-down view of an upper surface of the assembly, and FIGS. 7A and 7B are diagrammatic cross-sectional side views along the lines A-A and B-B of FIG. 7, respectively. The top-down view of FIG. 7 does not show materials beneath the illustrated upper surface in order to simplify the drawing.

FIG. 8 is a diagrammatic top-down view of an upper surface of the assembly, and FIGS. 8A and 8B are diagrammatic cross-sectional side views along the lines A-A and B-B of FIG. 8, respectively. The top-down view of FIG. 8 does not show materials beneath the illustrated upper surface in order to simplify the drawing.

FIGS. 9-9B show the region of FIGS. 5-5B at an example process stage subsequent to that of FIGS. 8-8B. FIG. 9 is a diagrammatic top-down view of an upper surface of the assembly, and FIGS. 9A and 9B are diagrammatic cross-sectional side views along the lines A-A and B-B of FIG. 9, respectively. The top-down view of FIG. 9 does not show materials beneath the illustrated upper surface in order to simplify the drawing.

FIG. 10 is a diagrammatic top-down view of an upper surface of the assembly, and FIGS. 10A and 10B are diagrammatic cross-sectional side views along the lines A-A and B-B of FIG. 10, respectively. The top-down view of FIG. 10 does not show materials beneath the illustrated upper surface in order to simplify the drawing.

FIG. 11 is a diagrammatic top-down view of an upper surface of the assembly, and FIGS. 11A and 11B are diagrammatic cross-sectional side views along the lines A-A and B-B of FIG. 11, respectively. The top-down view of FIG. 11 does not show materials beneath the illustrated upper surface in order to simplify the drawing.

FIG. 12 is a diagrammatic top-down view of an upper surface of the assembly, and FIGS. 12A and 12B are diagrammatic cross-sectional side views along the lines A-A and B-B of FIG. 12, respectively. The top-down view of FIG. 12 does not show materials beneath the illustrated upper surface in order to simplify the drawing.

FIG. 13 is a diagrammatic top-down view of an upper surface of the assembly, and FIGS. 13A and 13B are diagrammatic cross-sectional side views along the lines A-A and B-B of FIG. 13, respectively. The top-down view of FIG. 13 does not show materials beneath the illustrated upper surface in order to simplify the drawing.

FIG. 14 is a diagrammatic top-down view of an upper surface of the assembly, and FIGS. 14A and 14B are diagrammatic cross-sectional side views along the lines A-A and B-B of FIG. 14, respectively. The top-down view of FIG. 14 does not show materials beneath the illustrated upper surface in order to simplify the drawing.

FIG. 15 is a diagrammatic top-down view of an upper surface of the assembly, and FIGS. 15A and 15B are diagrammatic cross-sectional side views along the lines A-A and B-B of FIG. 15, respectively. The top-down view of FIG. 15 does not show materials beneath the illustrated upper surface in order to simplify the drawing.

FIG. 15B-1 is a diagrammatic cross-sectional side view analogous to that of FIG. 15B, and shows another example process stage alternative to that of FIG. 15B.

FIG. 16 is a diagrammatic top-down view of an upper surface of the assembly, and FIGS. 16A and 16B are diagrammatic cross-sectional side views along the lines A-A and B-B of FIG. 16, respectively. The top-down view of FIG. 16 does not show materials beneath the illustrated upper surface in order to simplify the drawing.

FIG. 16B-1 is a diagrammatic cross-sectional side view analogous to that of FIG. 16B, and shows another example process stage alternative to that of FIG. 16B.

FIG. 17 is a diagrammatic top-down view of an upper surface of the assembly, and FIGS. 17A and 17B are diagrammatic cross-sectional side views along the lines A-A and B-B of FIG. 17, respectively.

FIG. 17B-1 is a diagrammatic cross-sectional side view analogous to that of FIG. 17B, and shows another example process stage alternative to that of FIG. 17B.

FIG. 18 is a diagrammatic top-down view of an upper surface of the assembly, and FIGS. 18A and 18B are diagrammatic cross-sectional side views along the lines A-A and B-B of FIG. 18, respectively.

FIG. 18B-1 is a diagrammatic cross-sectional side view analogous to that of FIG. 18B, and shows another example process stage alternative to that of FIG. 18B.

DETAILED DESCRIPTION OF THE ILLUSTRATED EMBODIMENTS

Some embodiments include integrated assembles (e.g., integrated memory) having laterally-extending capacitors with container-shaped first electrodes, and with second electrodes that extend along inner and outer surfaces of the first electrodes. Some embodiments include methods of forming laterally-extending capacitors. Example embodiments are described with reference to FIGS. 5-18.

Figure 5:
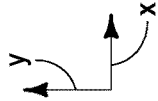
FIGS. 5-5B show a region of an integrated assembly at an example process stage of an example method.
Figure 5A:
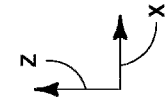
Figure 5B:
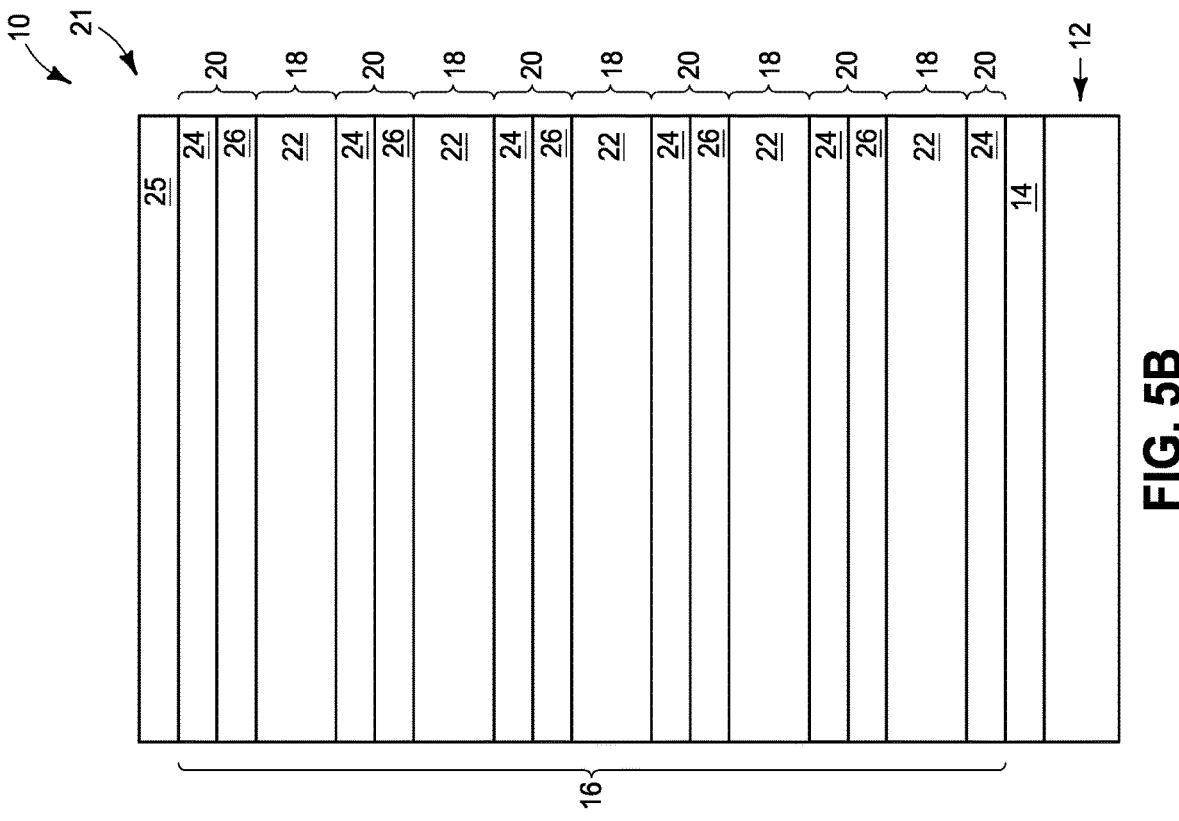
Figure 5B:
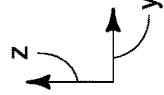

Referring to FIGS. 5-5B, a region of an integrated assembly 10 is shown in cross-sectional side views (FIGS. 5A and 5B), and in top-down view (FIG. 5). Axes are provided adjacent to the views of FIGS. 5-5B to assist the reader in understanding the relative orientation of the drawings. Specifically, the top-down view of FIG. 5 is shown to be oriented relative to an X/Y axis system, the cross-sectional side view of FIG. 5A is shown to be oriented relative to an X/Z axis system, and the cross-sectional side view of FIG. 5B is shown to be oriented relative to a Y/Z axis system.

The integrated assembly 10 includes a base 12 and a material 14 over the base. The base 12 may comprise semiconductor material; and may, for example, comprise, consist essentially of, or consist of monocrystalline silicon. The base 12 may be referred to as a semiconductor substrate.

The material 14 may be an insulative etch-stop material, and may comprise any suitable composition(s). In some embodiments, the material 14 may comprise a metal oxide. In some embodiments, the material 14 may comprise, consist essentially of, or consist $ZrO_x$, where x is a number. In some embodiments, the $ZrO_x$ may be referred to as zirconium oxide.

A stack 16 is formed over the material 14. The stack 16 comprises alternating first and second levels 18 and 20. The first levels 18 comprise semiconductor material 22, and the second levels 20 comprise insulative material.

In some embodiments, the levels 20 may be referred to as insulative levels. In the illustrated embodiment, the insulative material within at least some of the second levels 20 includes a first composition 24 and a second composition 26. The levels 20 may include one or both of the compositions 24 and 26. In some embodiments, the composition 24 may comprise, consist essentially of, or consist of silicon dioxide or carbon-doped silicon dioxide. If the composition 24 comprises carbon-doped silicon dioxide, the carbon may be present to an example concentration within a range of from about $10^{15}$ atoms/cm$^3$ to about $10^{25}$ atoms/cm$^3$. In some embodiments, the composition 26 may comprise, consist essentially of, or consist of silicon nitride. In some embodiments, the levels 20 may comprise one or more insulative compositions other than one or both of the indicated compositions 24 and 26, or in addition to the indicated compositions 24 and 26.

The semiconductor material 22 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 22 may comprise, consist essentially of, or consist of silicon.

The semiconductor material 22 may correspond to semiconductor material (e.g., channel material) analogous to that described above with reference to FIGS. 1-4 as the material 1204 and 1304. In such embodiments, the configuration of FIGS. 5-5B may correspond to a process stage utilized to fabricate memory analogous to any of the memory described above with reference to FIGS. 1-4. Accordingly, vertically-extending digit lines or vertically-extending wordlines may be proximate to the illustrated region of the assembly 10 of FIGS. 5-5B.

Eventually, laterally-extending capacitors are formed along the levels 18, and such capacitors may be analogous to the capacitors 1208 and 1308 of FIGS. 1-4. Accordingly, the capacitors may be incorporated into memory cells of a three-dimensional memory array. There may be any suitable number of the levels 18 to form the three-dimensional memory array to a desired vertical height. Although the embodiment of FIGS. 5A and 5B shows the stack 16 comprising five of the levels 18, it is to be understood that in some embodiments the stack 16 may comprise a large number of the vertically-stacked levels 18; and may, for example, comprise eight of the vertically-stacked levels 18, 16 of the vertically-stacked levels 18, 32 of the vertically-stacked levels 18, 64 of the vertically-stacked levels 18, 128 of the vertically-stacked levels 18, 256 of the vertically-stacked levels 18, 512 of the vertically-stacked levels 18, etc.

A masking material (hard mask material) 25 is illustrated as an uppermost material of the assembly 10, and is shown to extend across the stack 16. The material 25 may comprise any suitable composition(s), and in some embodiments may comprise, consist essentially of, or consist of one or more of silicon nitride, carbon, silicon oxynitride, etc.

FIG. 5A shows that insulative panels 23 extend vertically through the stack 16. In the illustrated embodiment, the insulative panels also extend through the etch-stop material 14. In other embodiments, the insulative panels may stop at an upper surface of the etch-stop material.

The insulative panels 23 extend in and out of the page relative to the cross-sectional view of FIG. 5A, and accordingly extend laterally along a direction corresponding to the y-axis direction of FIG. 5. In some embodiments, such y-axis direction may be referred to as a first direction.

In the illustrated embodiment, the insulative panels each comprise a central insulative material 27, and each comprise outer insulative materials 29 and 31 extending along the peripheral edges of the central insulative material. In some embodiments, the central insulative material may comprise, consist essentially of, or consist of silicon dioxide, and may be formed as, for example, a spin-on dielectric. The outer materials 29 and 31 may comprise silicon nitride and gate dielectric material, respectively. The gate dielectric material may comprise, for example, silicon dioxide and/or one or more high-k compositions (e.g., aluminum oxide, hafnium oxide, zirconium oxide, etc.). The term high-k means a dielectric constant greater than that of silicon dioxide (e.g., greater than about 3.7).

In some embodiments, the configuration of FIGS. 5-5B may be considered to correspond to a construction 21 which comprises the stack 16 and the insulative panels 23 extending through the stack.

Figure 6:
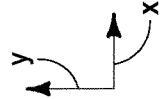
FIGS. 6-6B show the region of FIGS. 5-5B at an example process stage subsequent to that of FIGS. 5-5B.
Figure 6A:
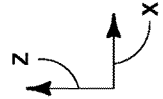
Figure 6B:
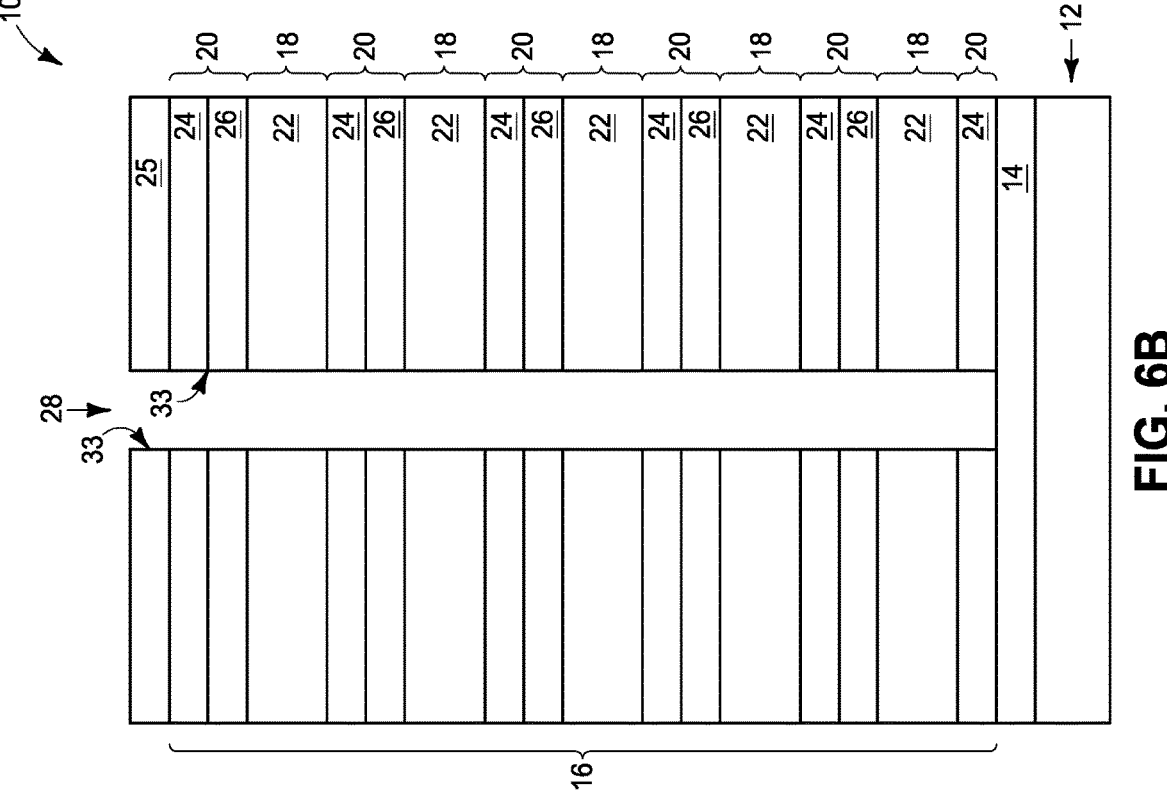

Referring to FIGS. 6-6B, a trench (opening) 28 is formed to extend through the stack 16. In the shown embodiment, the trench stops at an upper surface of the etch-stop material 14. In other embodiments, the trench may penetrate into the etch-stop material 14.

The trench 28 extends along a second direction that crosses the first direction of the panels 23 (i.e., that crosses the illustrated y-axis direction). In the shown embodiment, the trench 28 extends laterally along an illustrated x-axis direction, and thus extends substantially orthogonally to the y-axis direction. The term "substantially orthogonal" means orthogonal to within reasonable tolerances of fabrication and measurement.

The illustrated trench 28 may be representative of a large number of substantially identical trenches formed through the stack 16 during the patterning of three-dimensional memory (e.g., memory analogous any of that described above with reference to FIGS. 1-4).

The trench 28 has sidewalls 33 that extend along the materials 22, 24 and 26 of the levels 18 and 20.

It is noted that the top-down view of FIG. 6 does not show materials beneath the illustrated upper surface in order to simplify the drawing. Similarly, the other top-down views of this disclosure do not show materials beneath illustrated upper surfaces.

Figure 7:
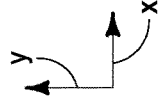
FIGS. 7-7B show the region of FIGS. 5-5B at an example process stage subsequent to that of FIGS. 6-6B.
Figure 7A:
Figure 7B:
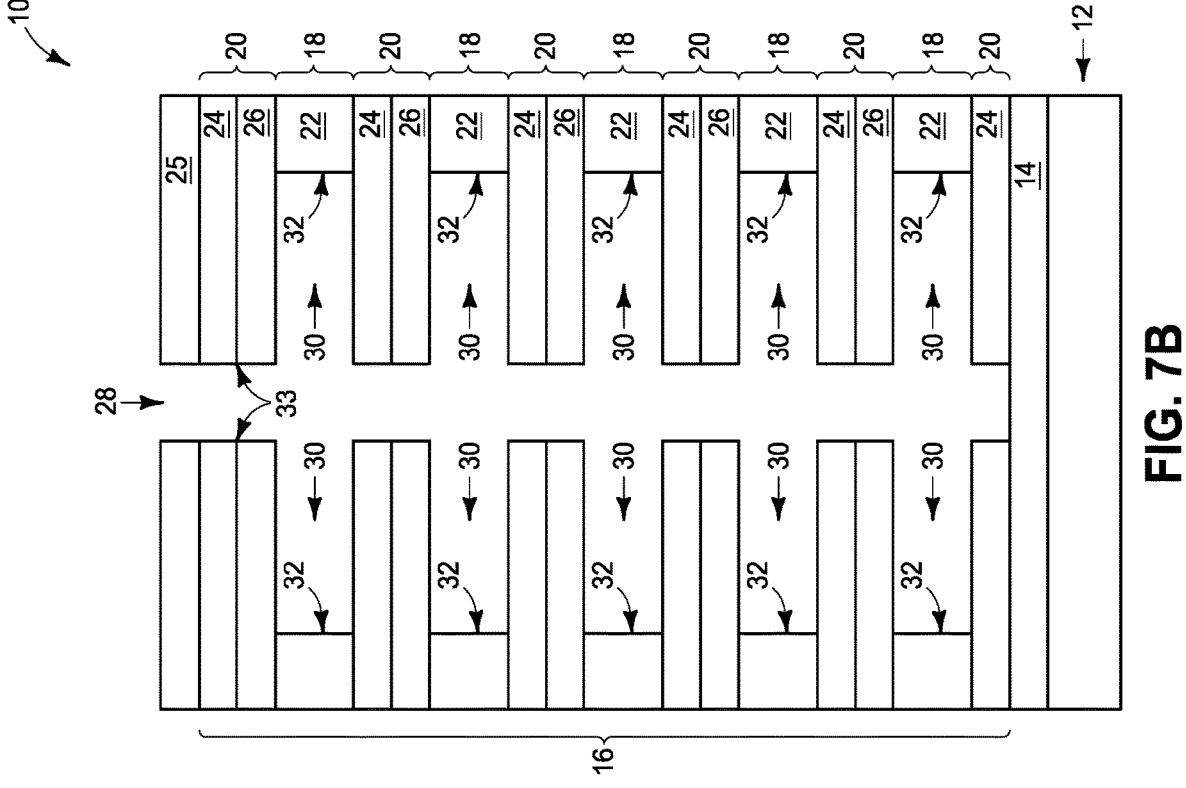

Referring to FIGS. 7-7B, the semiconductor material (channel material) 22 is recessed from the sidewalls 33 of the trench 28 to form cavities 30 extending laterally outwardly from the interior of the trench. In some embodiments, the laterally-extending cavities 30 may be considered to be adjacent to the trench 28.

FIG. 7A shows that each of the cavities 30 is between a pair of neighboring insulative panels 23. For instance one of the cavities is labeled 30a, and is shown to be between a pair of neighboring insulative panels labeled 23a and 23b.

Only some of the semiconductor material 22 is removed from the levels 18 during the formation of the cavities 30. Remaining regions of the semiconductor material 22 define lateral peripheries 32 of the cavities, with such lateral peripheries being distal from the trench 28.

Figure 8:
FIGS. 8-8B show the region of FIGS. 5-5B at an example process stage subsequent to that of FIGS. 7-7B.
Figure 8A:
Figure 8B:
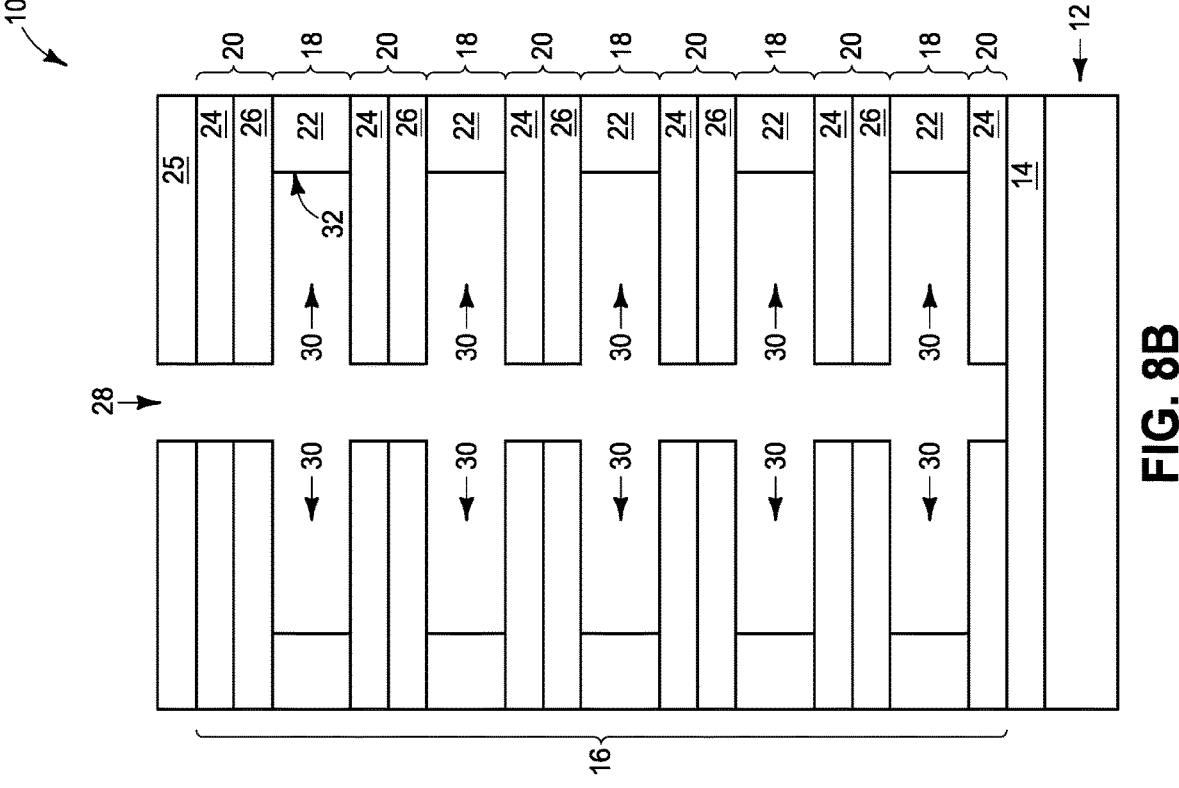

Referring to FIGS. 8-8B, the cavities 30 are extended through the outer insulative materials 29 and 31 of the panels 23 utilizing one or more etchants provided within the cavities 30. Such extends the cavities to the central insulative material 27 of the panels 23, and thus exposes the central insulative material 27 along lateral edges of the cavities 30 (as shown in FIG. 8A).

Figure 9:
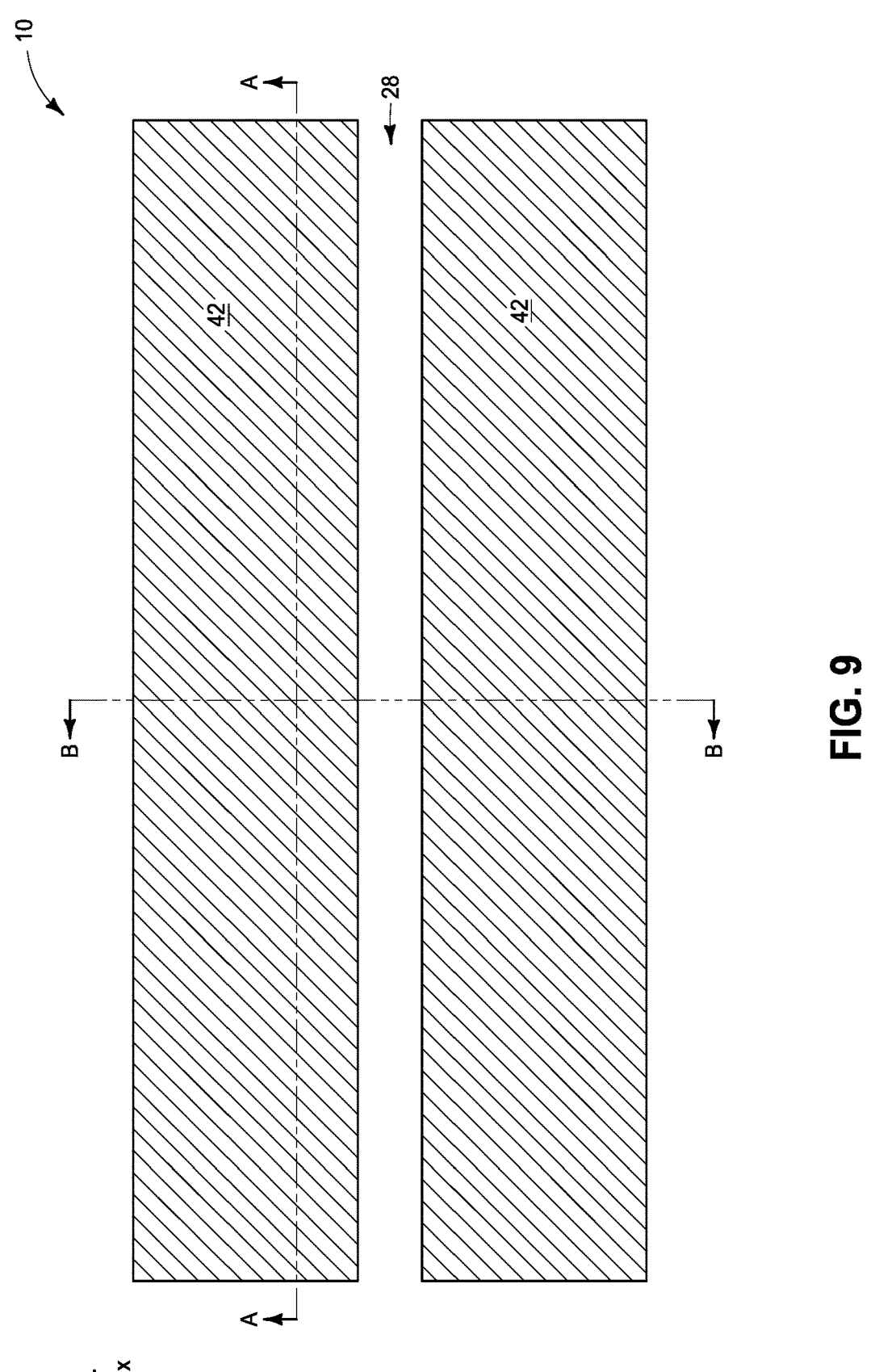
Figure 9A:
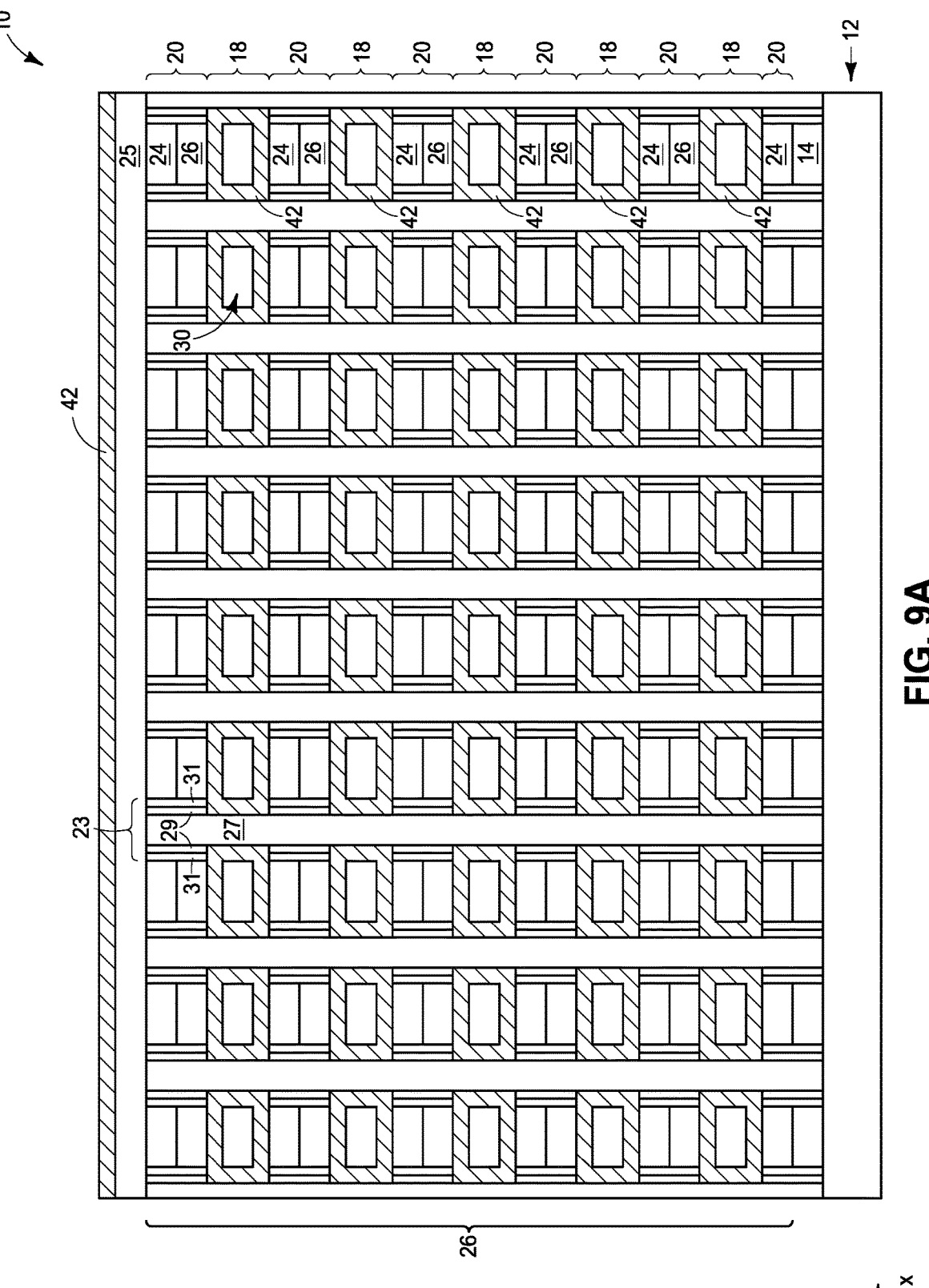

Referring to FIGS. 9-9B, dopant is flowed into the trench 28 and along the cavities 30 to dope regions of the semiconductor material 22, and to thereby form source/drain regions 34 along the lateral peripheries 32. The dopant within the source/drain regions 34 is diagrammatically illustrated with stippling to assist the reader in visualizing the source/drain regions. The source/drain regions 34 may be analogous to the regions 1240 and 1340 described above with reference to FIGS. 1-4.

The dopant may comprise any suitable composition(s). In some embodiments, the dopant may comprise one or both of phosphorus and arsenic, the semiconductor material 22 may comprise silicon, and the source/drain regions 34 may correspond to n-type doped regions.

A first capacitor electrode material 42 is formed to line the trench 28 and to line the cavities 30. The first capacitor electrode material 42 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first capacitor electrode material 42 may comprise, consist essentially of, or consist of metal nitride (e.g., titanium nitride).

Figure 10:
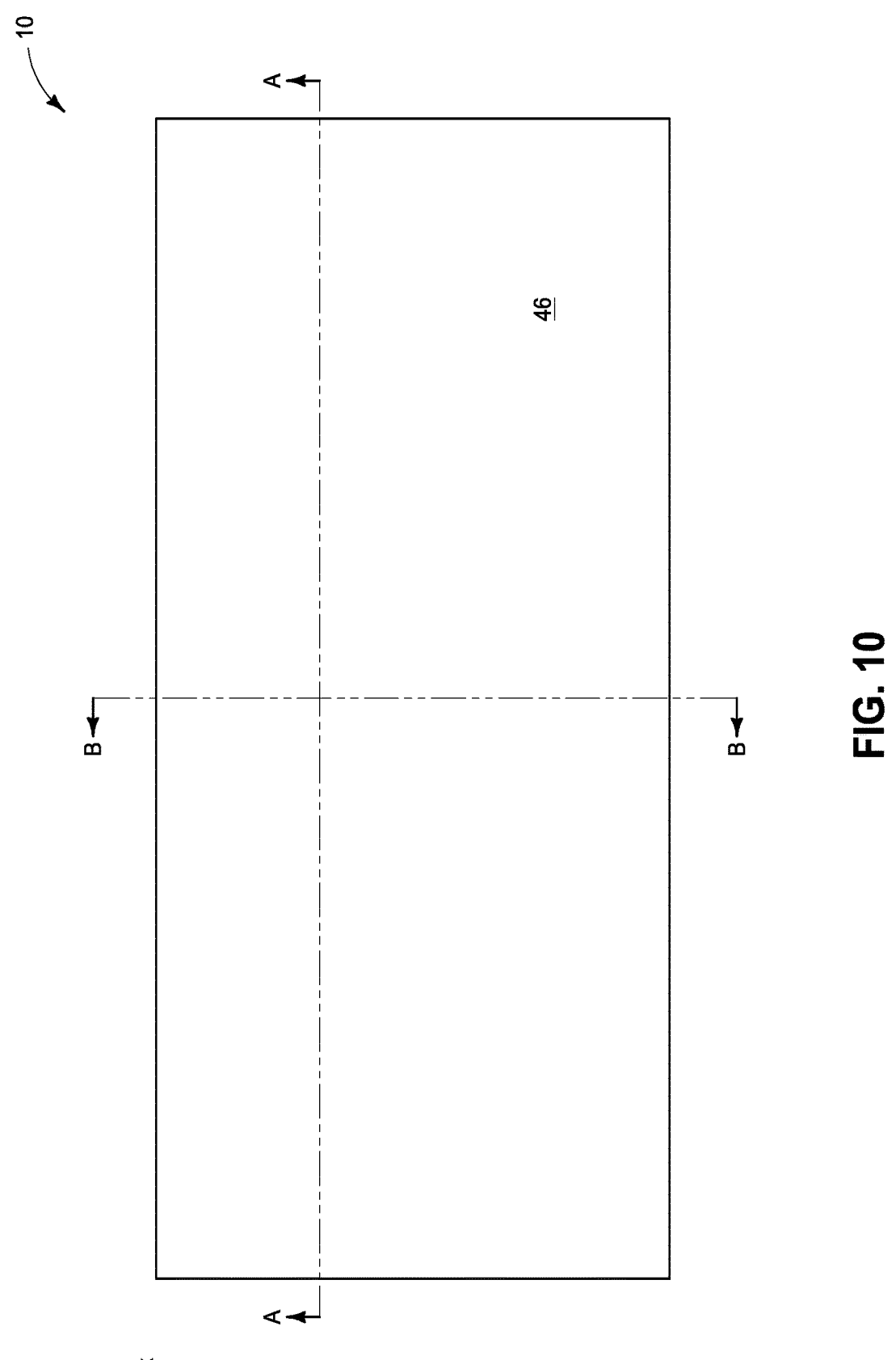
FIGS. 10-10B show the region of FIGS. 5-5B at an example process stage subsequent to that of FIGS. 9-9B.
Figure 10A:
Figure 10B:
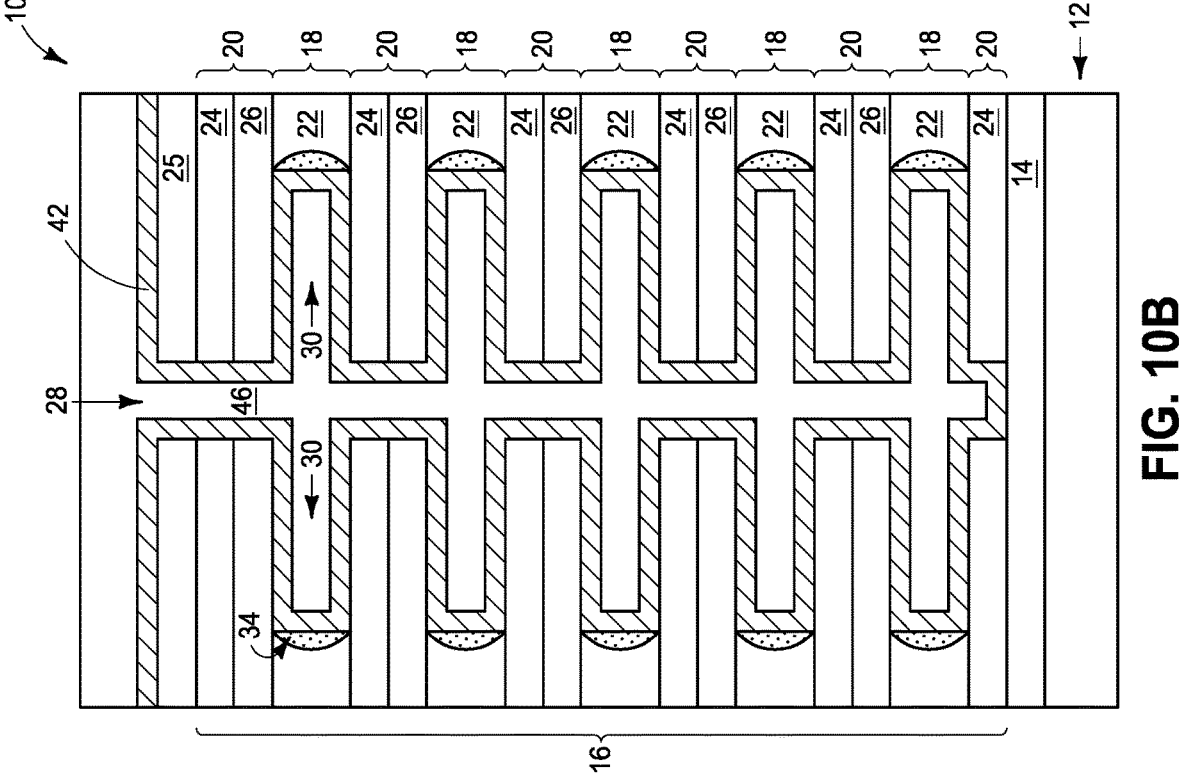
Figure 10B:
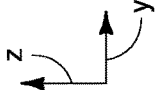

Referring to FIGS. 10-10B, sacrificial material 46 is formed within the trench 28 and within the cavities 30. The sacrificial material 46 may comprise any suitable composition(s), and in some embodiments may comprise, consist essentially of, or consist of silicon (e.g., one or both of polycrystalline silicon and amorphous silicon).

Figure 11:
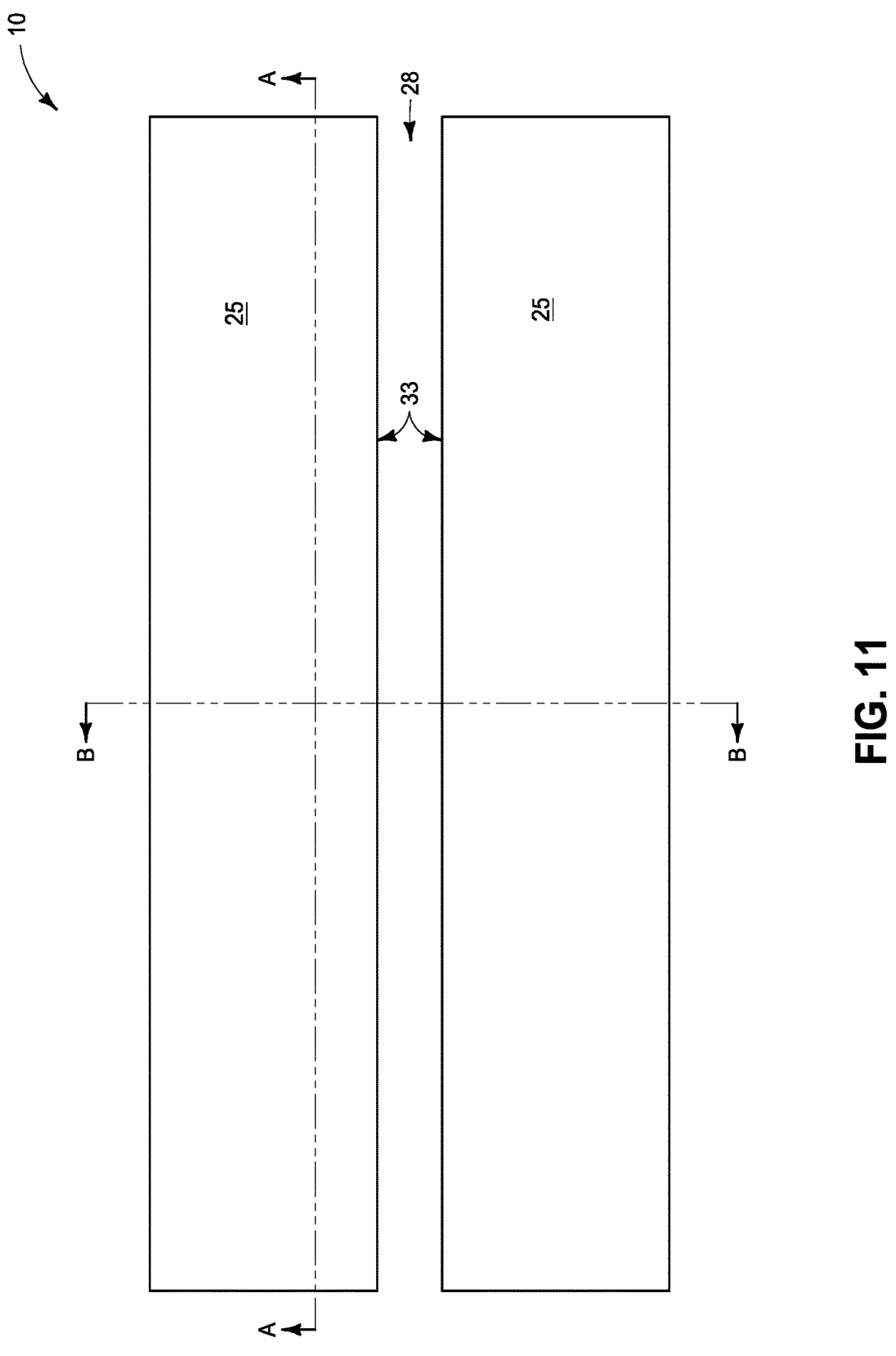
FIGS. 11-11B show the region of FIGS. 5-5B at an example process stage subsequent to that of FIGS. 10-10B.
Figure 11A:
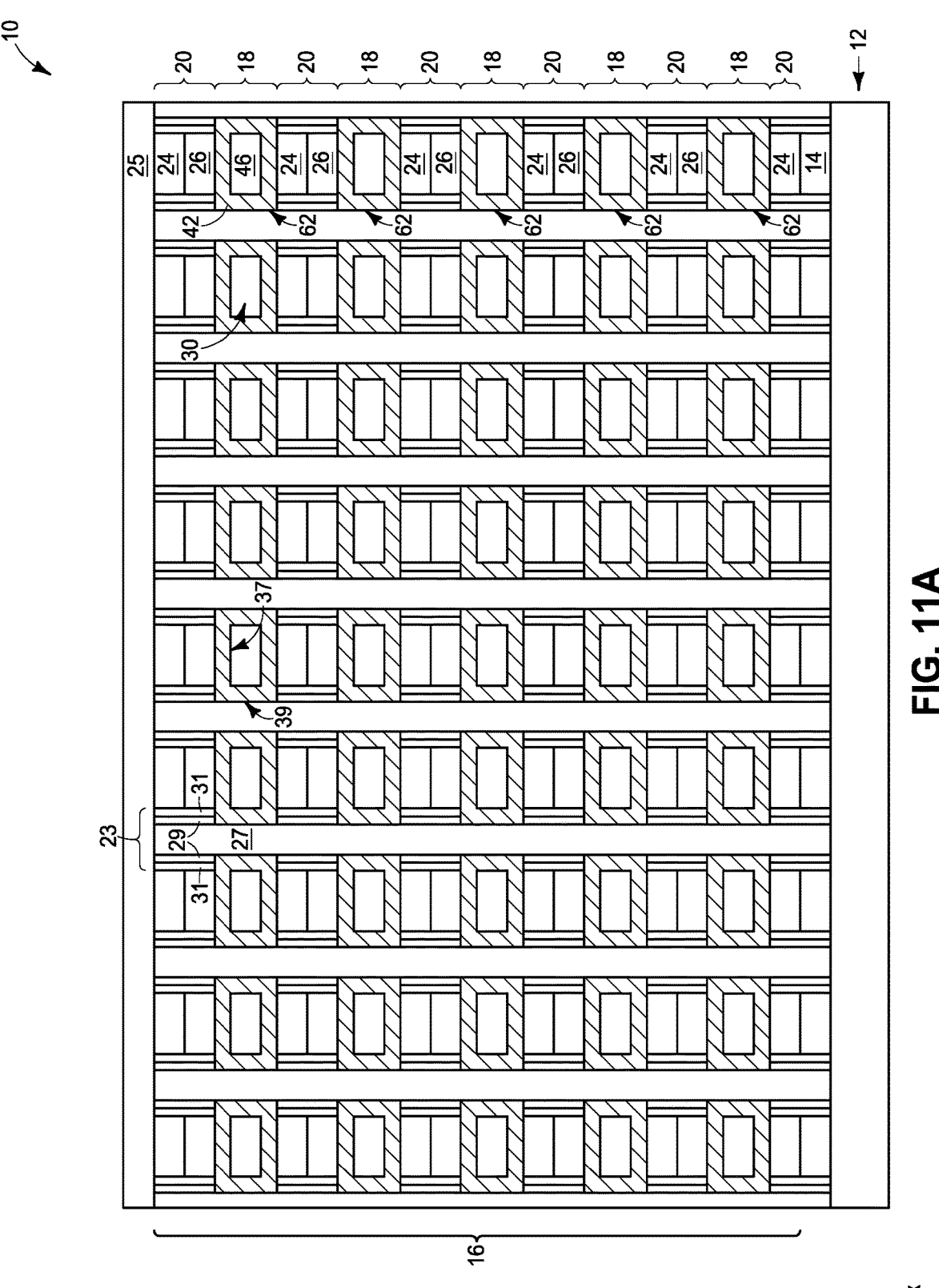
Figure 11B:
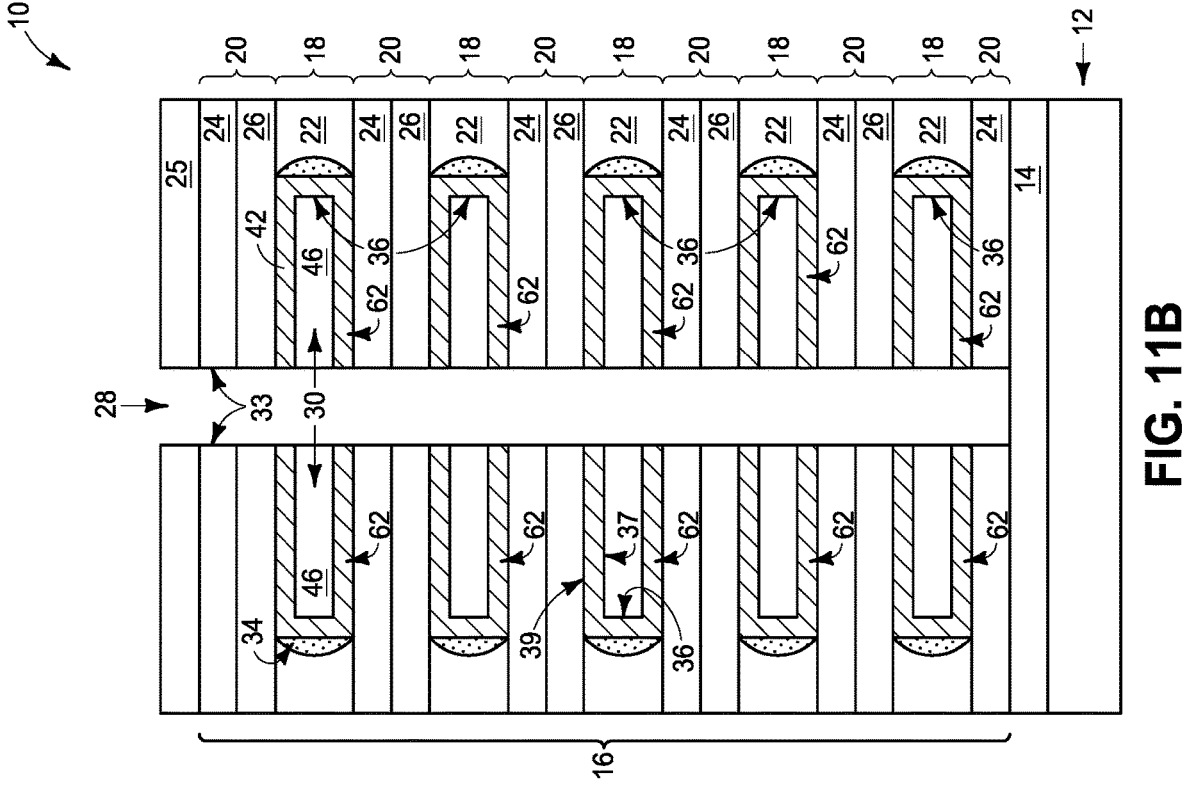

Referring to FIGS. 11-11B, the trench 28 is reestablished with one or more suitable etches. Such removes excess material 42 from along the sidewalls 33 of the trench 28. The sacrificial material 46 functions as a protective material which protects the material 42 within the cavities 30.

The material 42 within the cavities 30 is patterned into container-shaped capacitor electrodes 62. Regions 36 of the capacitor electrodes 62 are coupled with the source/drain regions 34. The container-shaped electrodes 62 have inner surfaces 37 within the container shapes (i.e., along the cavities 30), and have outer surfaces 39 outward of the container-shapes and in opposing relation to the inner surfaces. The outer surfaces 39 are along the insulative material 27 of the insulative panels 23. In the illustrated embodiment, the container-shaped electrodes 62 are substantially rectangular-shaped along the cross-section of FIG. 11B. In other embodiments, the container-shaped electrodes may have other configurations.

Figure 12:
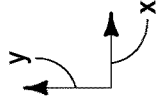
FIGS. 12-12B show the region of FIGS. 5-5B at an example process stage subsequent to that of FIGS. 11-11B.
Figure 12A:
Figure 12B:
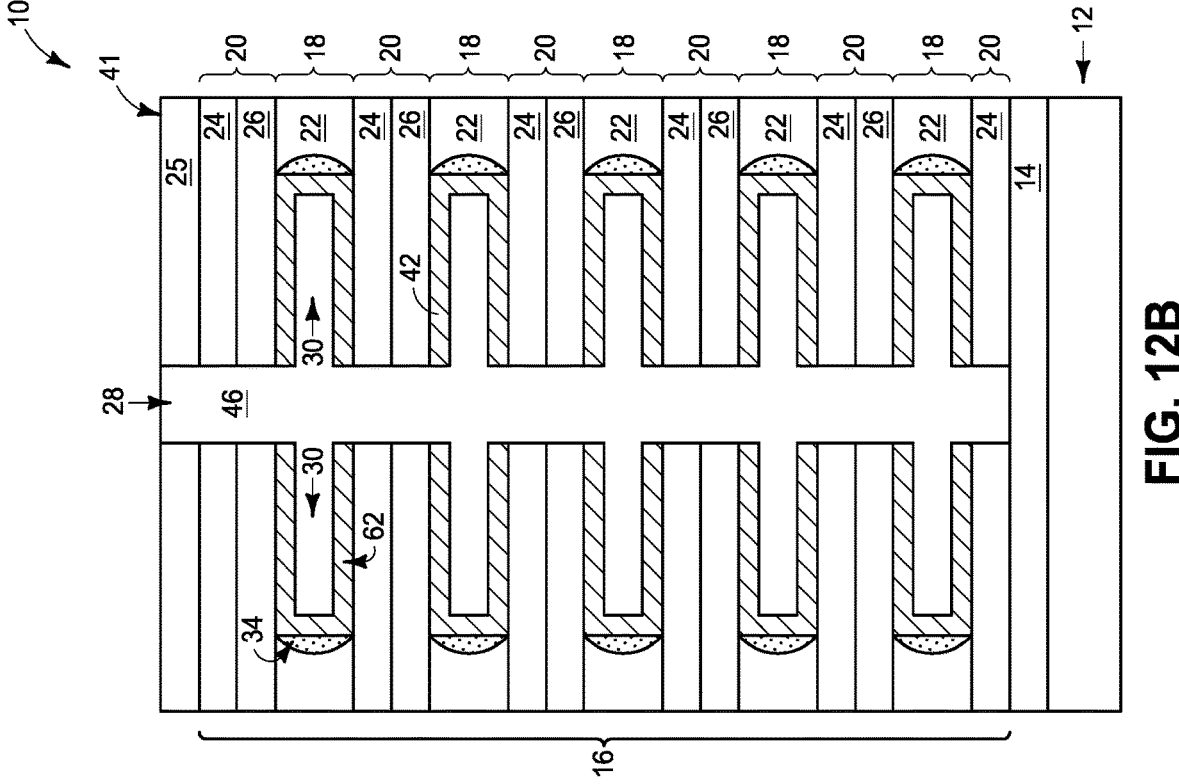

Referring to FIGS. 12-12B, additional sacrificial material 46 is formed within the trench 28 to refill the trench with the sacrificial material. A planarized surface 41 is formed to extend across the materials 25 and 46. The planarized surface may be formed with any suitable processing, including, for example, chemical-mechanical polishing (CMP).

Figure 13:
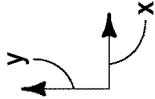
FIGS. 13-13B show the region of FIGS. 5-5B at an example process stage subsequent to that of FIGS. 12-12B.
Figure 13A:
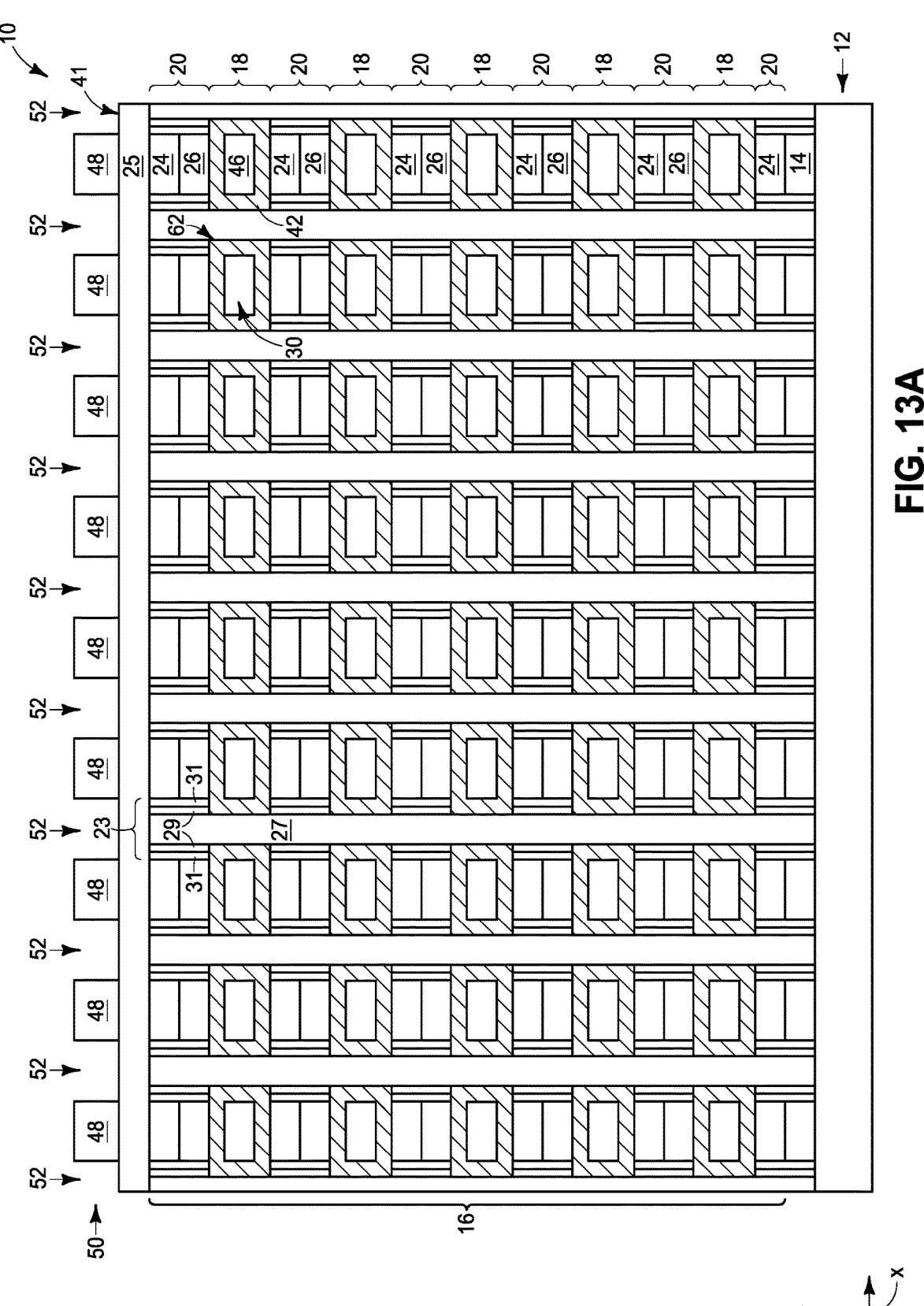
Figure 13B:
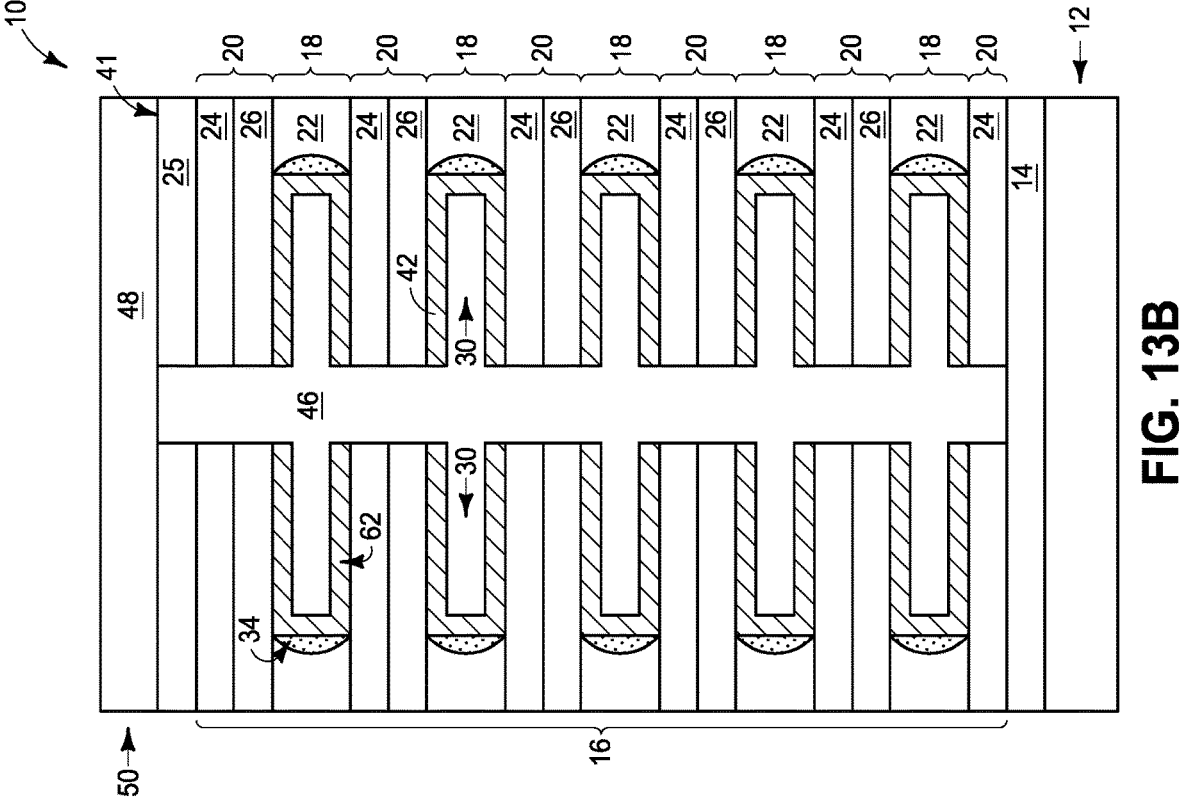
Figure 13B:
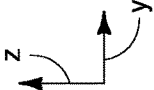

Referring to FIG. 13-13B, a patterned mask 50 is formed over the planarized surface 41. The mask 50 comprises a masking material 48. The material 48 may comprise any suitable composition(s); and in some embodiments may include carbon (e.g., amorphous carbon) and/or may include photolithographically-patterned photoresist.

Openings 52 extend through the masking material 48. The openings 52 are aligned with the insulative panels 23. The openings 52 are utilized for removing some or all of the material of the insulative panels. The openings 52 may have any suitable size and shape to expose a sufficient proportion of the insulative panels 23 to enable the desired removal of some or all of the material of the insulative panels. There may be any suitable number of the openings 52, with such openings being spaced from one another along the y-axis direction by any suitable amount. The illustrated openings are circular in top-down view (shown in FIG. 13). In other embodiments, the openings may be elliptical, rectangular, square, etc., in top-down view.

Figure 14:
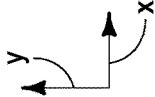
FIGS. 14-14B show the region of FIGS. 5-5B at an example process stage subsequent to that of FIGS. 13-13B.
Figure 14A:
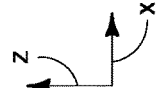
Figure 14B:
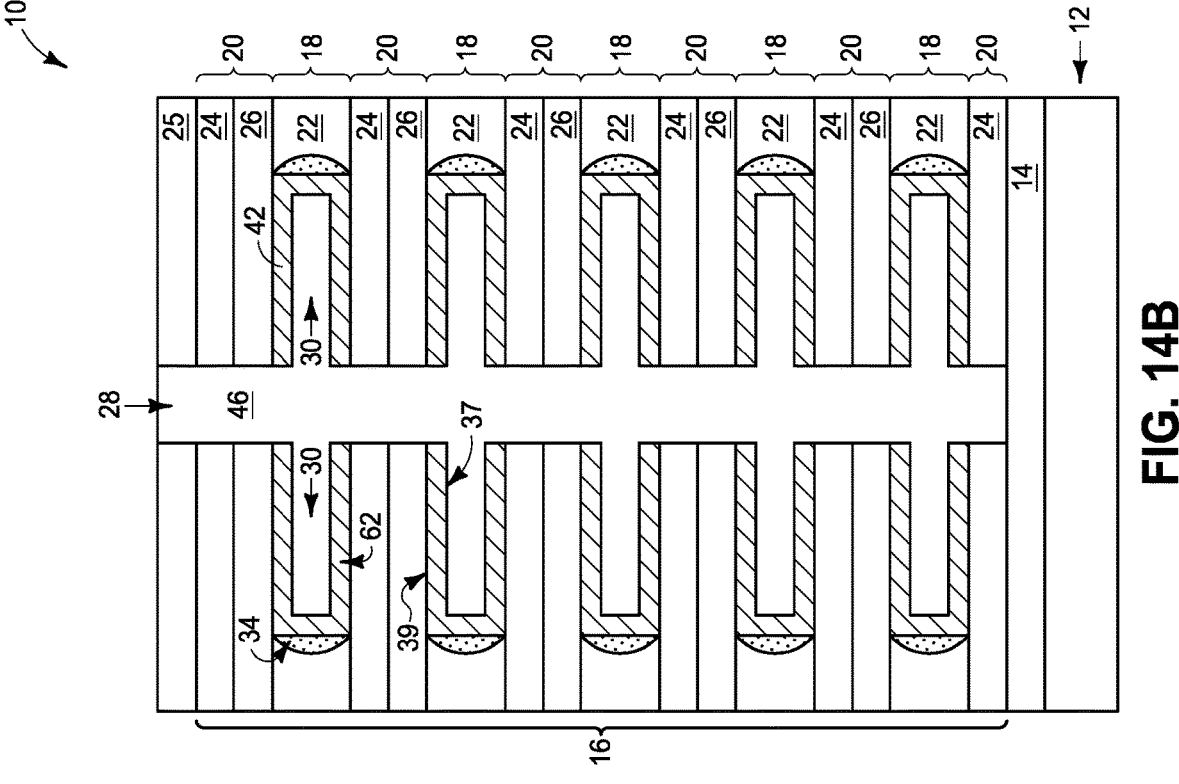

Referring to FIGS. 14-14B, the openings 52 are extended through the material 25 and through the material 27 (FIG. 13A) of the panels 23 (FIG. 13A), and the masking material 48 (FIGS. 13-13B) is removed. The openings 52 may be utilized to remove an entirety of the insulative material 27 of the panels (or at least the majority of the insulative material 27 of the panels 23). In some embodiments, regions of the material 27 directly under the openings 52 may be removed with dry etching conditions, and then regions of the material 27 laterally between the openings 52 may be removed with a short-duration wet etch. However, depending on the size and shape of the openings 52, the etching conditions utilized to remove the material 27 may vary. For instance, if the openings are tailored to expose the vast majority of the material 27 which is to be removed, then such removal may be accomplished utilizing only dry etching.

The removal of the material 27 exposes the outer surfaces 39 of the container-shaped capacitor electrodes 62.

Figure 15:
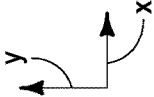
FIGS. 15-15B show the region of FIGS. 5-5B at an example process stage subsequent to that of FIGS. 14-14B.
Figure 15A:
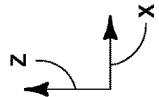
Figure 15B:
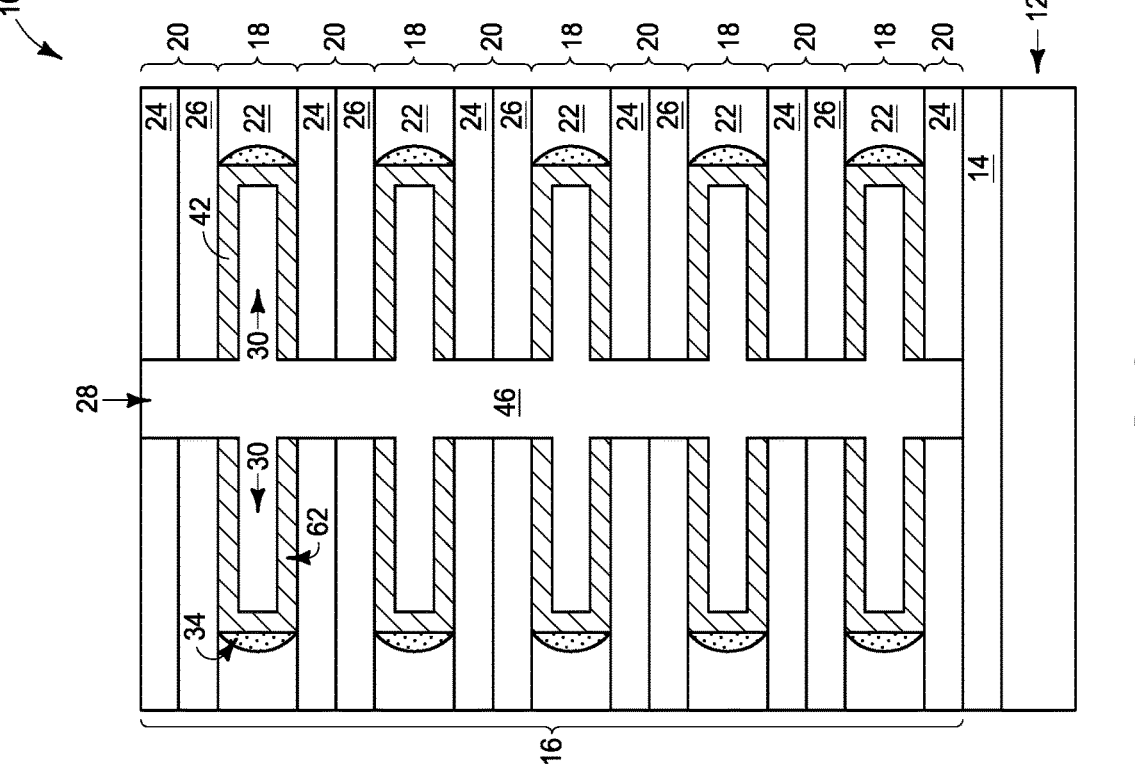
Figure 15B:
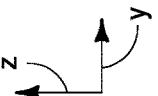
Figures 1, 15B:
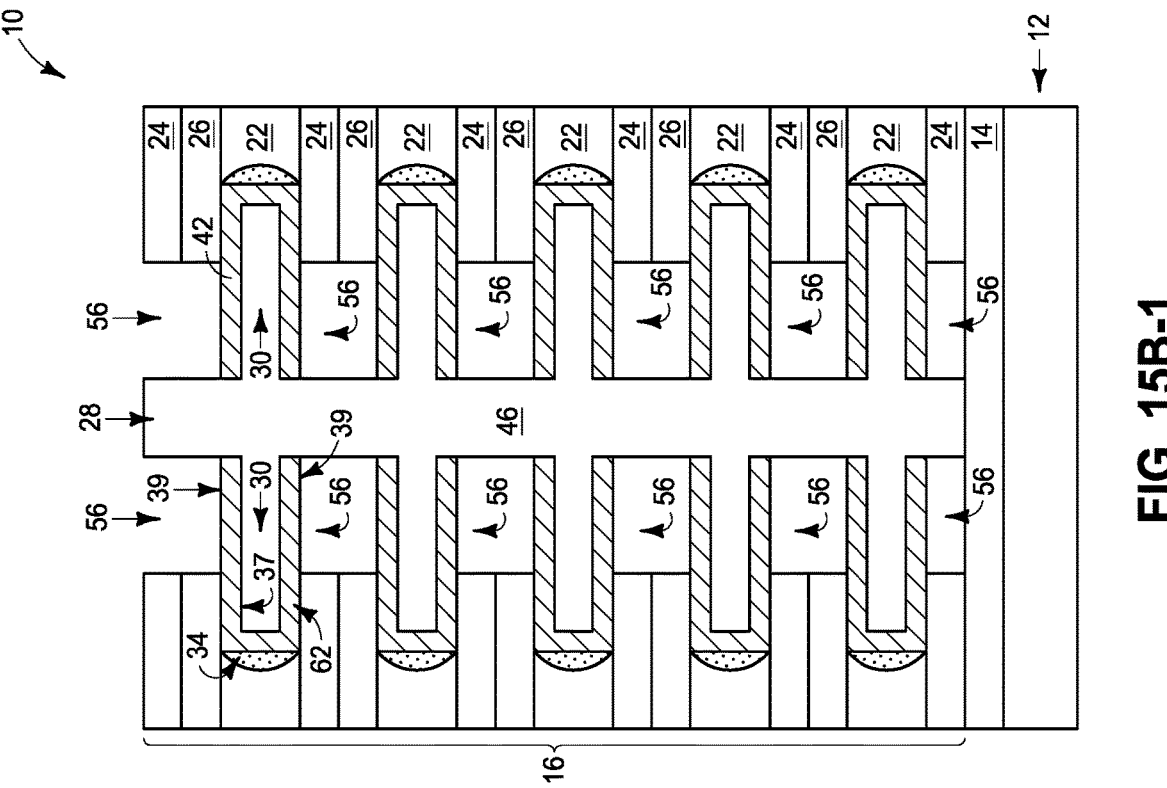

Referring to FIGS. 15-15B, the openings 52 are extended laterally through the materials 29 and 31 (FIG. 14A) with one or more suitable etches. Such exposes additional regions of the outer surfaces 39 of the container-shaped capacitor electrodes 62. In the illustrated embodiment, the material 26 within the insulative regions 20 is laterally-thinned at the process stage of FIGS. 15-15B, and the upper material 25 (FIGS. 14-14B) is removed. The material 24 within the insulative regions 20 is shown to not be affected by the etching utilized to widen the openings 52. In other embodiments, the material 24 may also be laterally thinned. Alternatively, in some embodiments neither of the materials 26 and 24 within the insulative levels 20 may be laterally thinned.

The illustrated processing of FIGS. 14-14B and 15-15B has removed the entirety of the materials of the insulative panels 23 (FIG. 13A). In other embodiments, it may be only portions of the insulative panels 23 that are removed.

Figure 1:
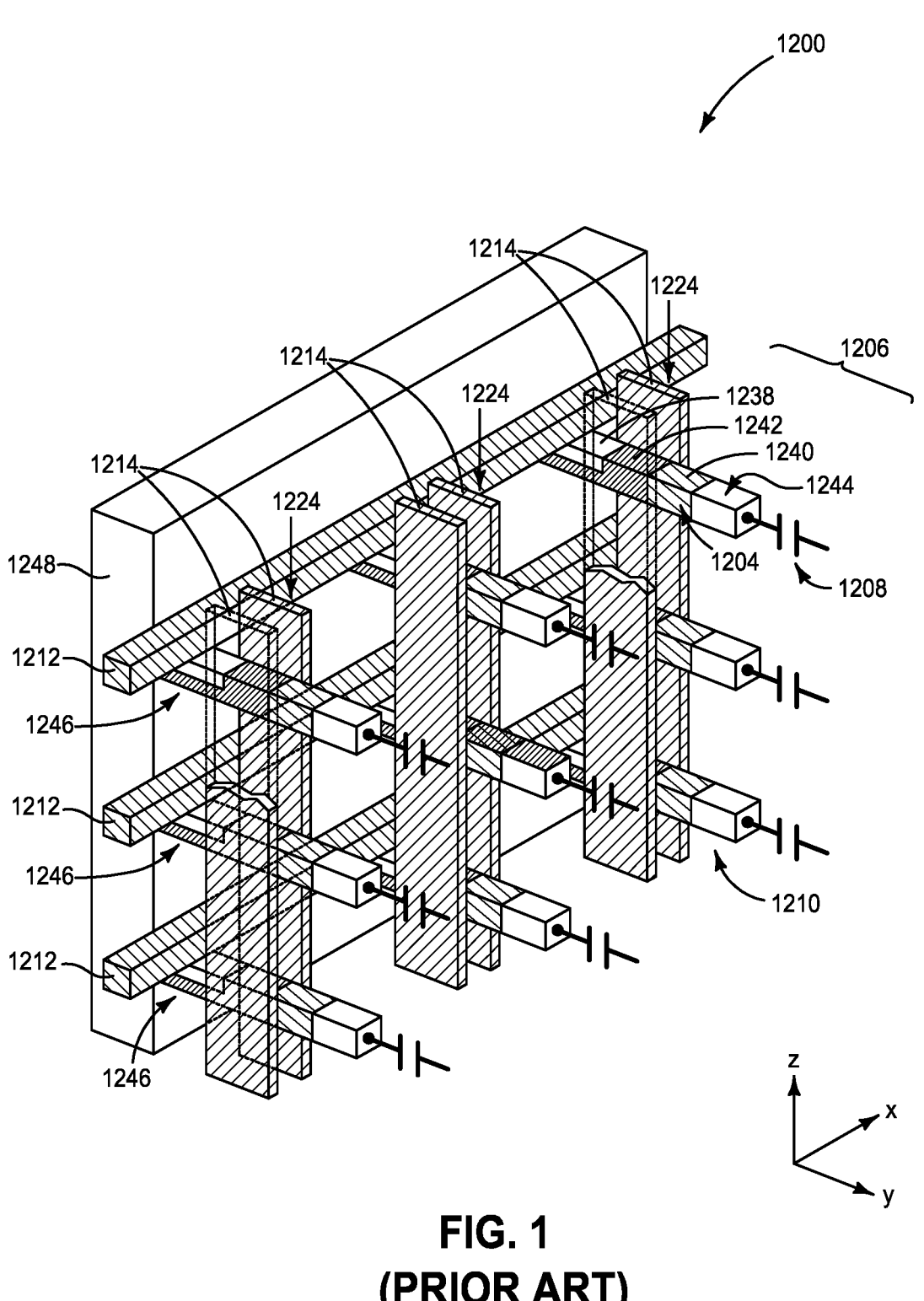
FIG. 1 is a diagrammatic three-dimensional view of a region of a prior art integrated assembly.
Figure 2:
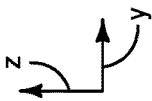
FIG. 2 is a diagrammatic cross-sectional side view of a region of a prior art assembly analogous to that of FIG. 1.
Figure 3:
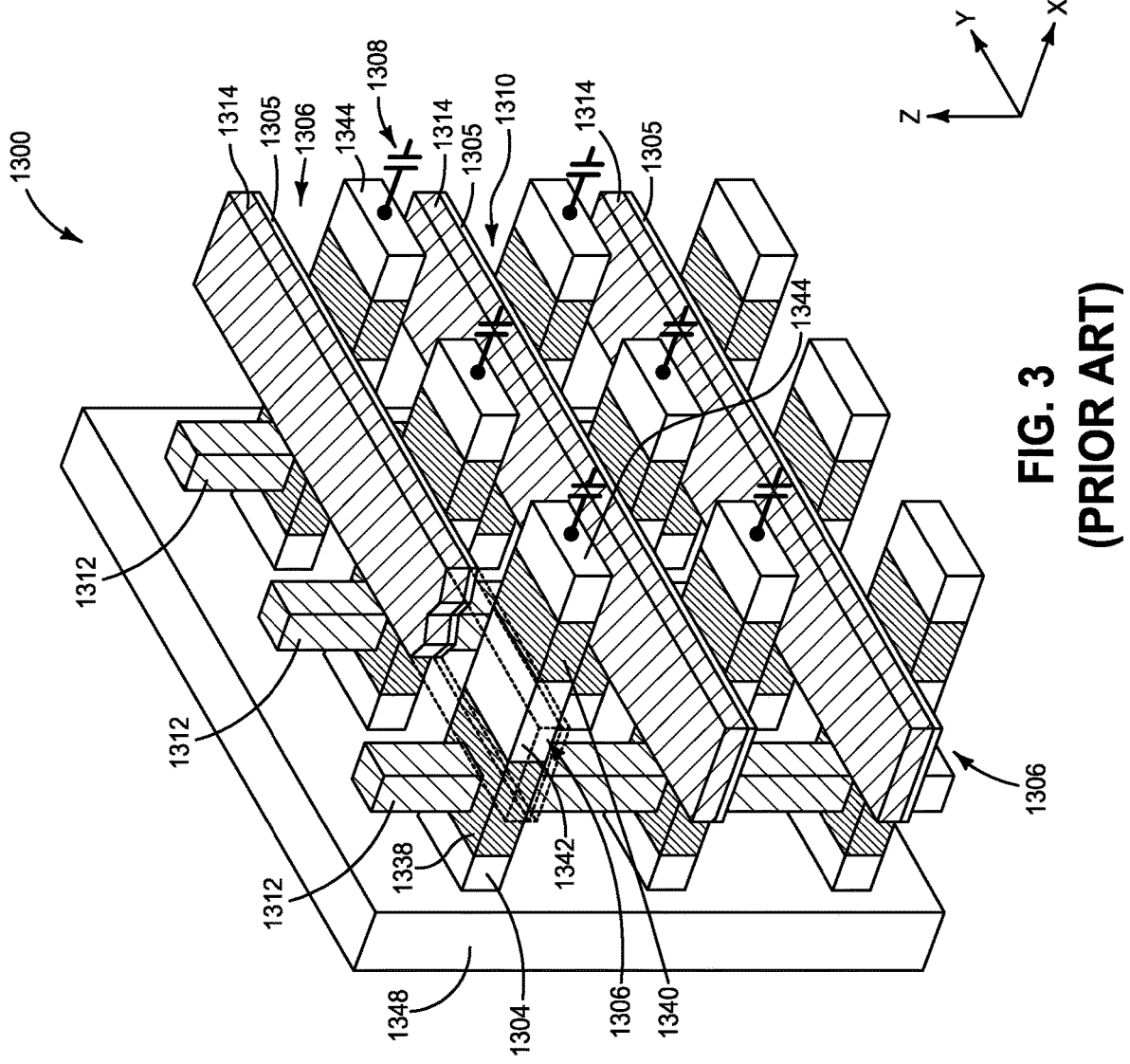
FIG. 3 is a diagrammatic three-dimensional view of a region of a prior art integrated assembly.
Figure 4:
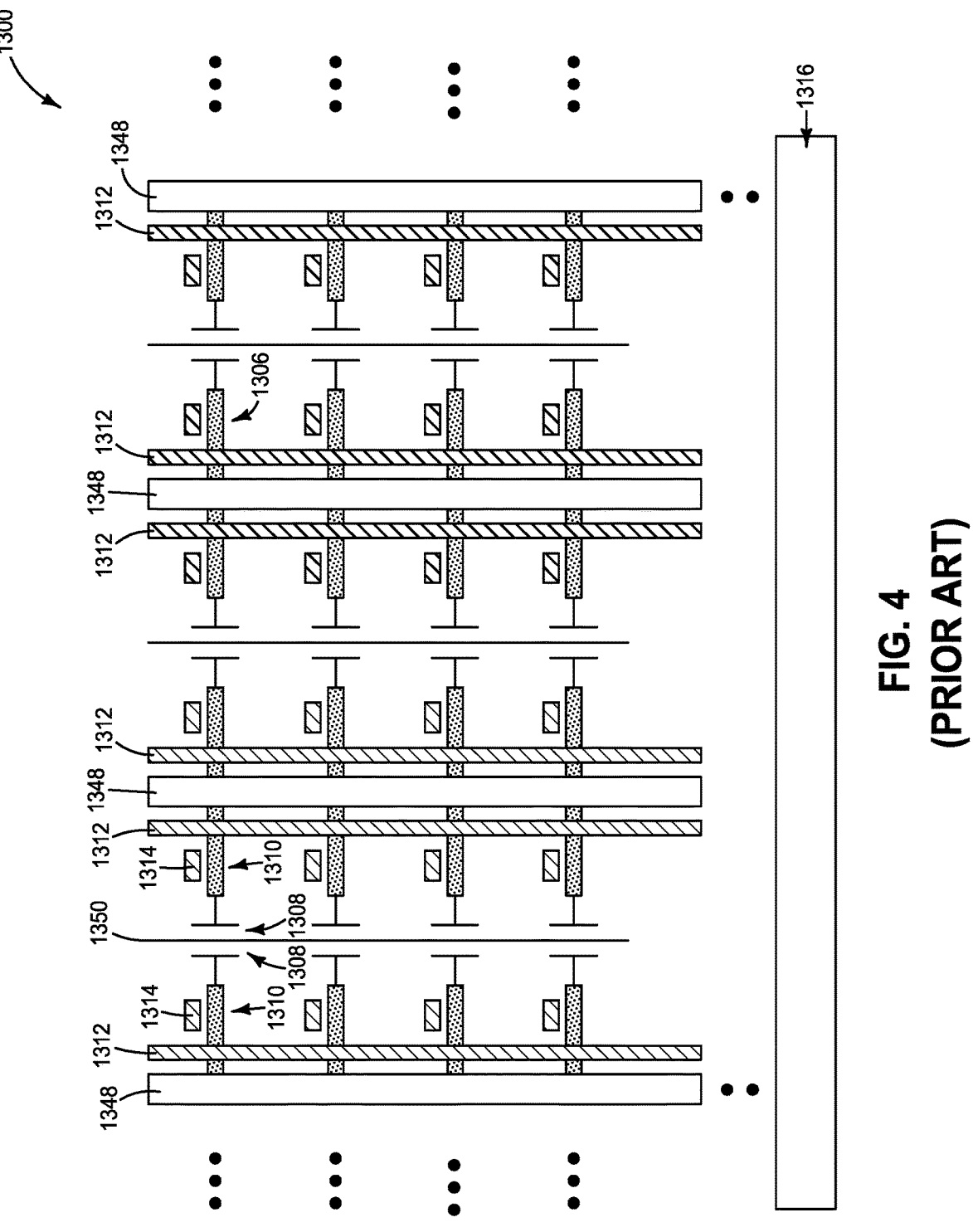
FIG. 4 is a diagrammatic cross-sectional side view of a region of a prior art assembly analogous to that of FIG. 3.

FIG. 15B-1 shows a process stage similar to that of FIG. 15B, but in which the materials 24 and 26 are recessed along the illustrated cross-section to leave gaps 56 adjacent to the container-shaped electrodes 62, and to thereby exposed regions of the outer surfaces 39 of such electrodes. In some embodiments, it may be only the material 26 which is recessed along the cross-section of FIG. 15B-1, rather than both of the materials 26 and 24. Whether or not one or both of the materials 26 and 24 is recessed along the cross-section of FIG. 15B-1 may be determined by the etching conditions utilized to extend the openings 52 (FIG. 15A), including, for example, the duration of the etch(es), the etchant(s) utilized, and the degree of isotropy versus anisotropy of the etch(es).

Figure 16:
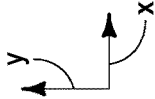
FIGS. 16-16B show the region of FIGS. 5-5B at an example process stage subsequent to that of FIGS. 15-15B.
Figure 16A:
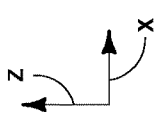
Figure 16B:
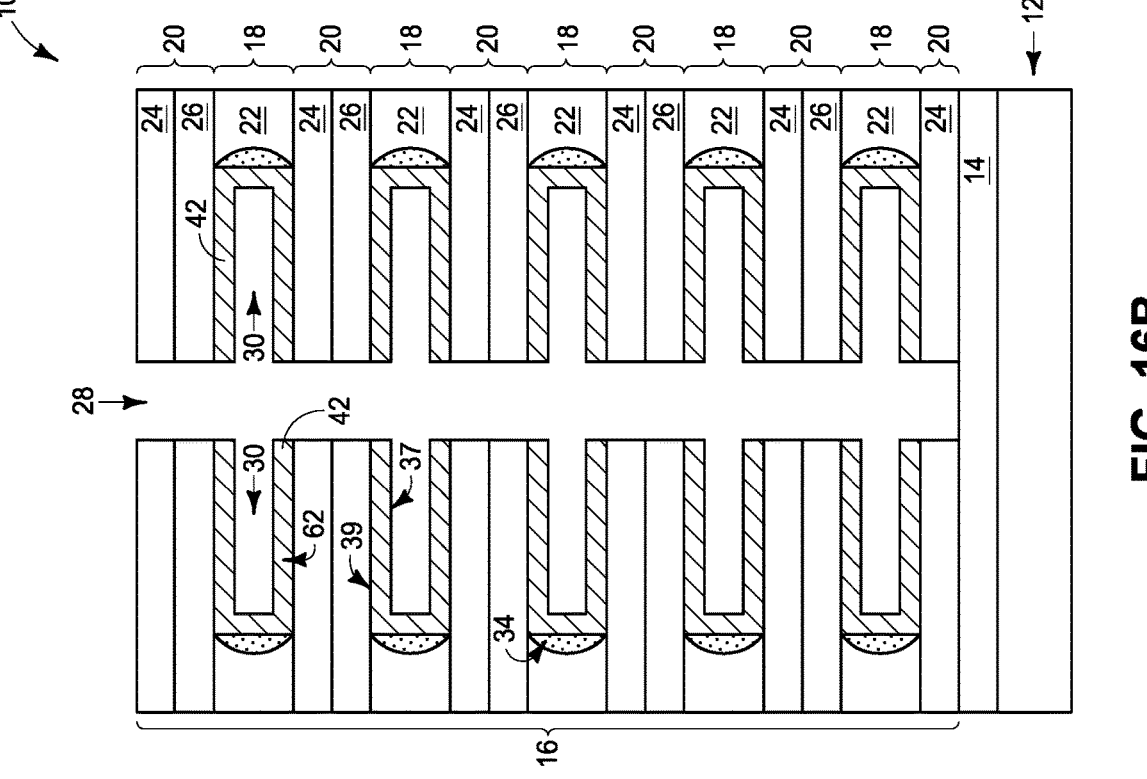
Figure 16B:
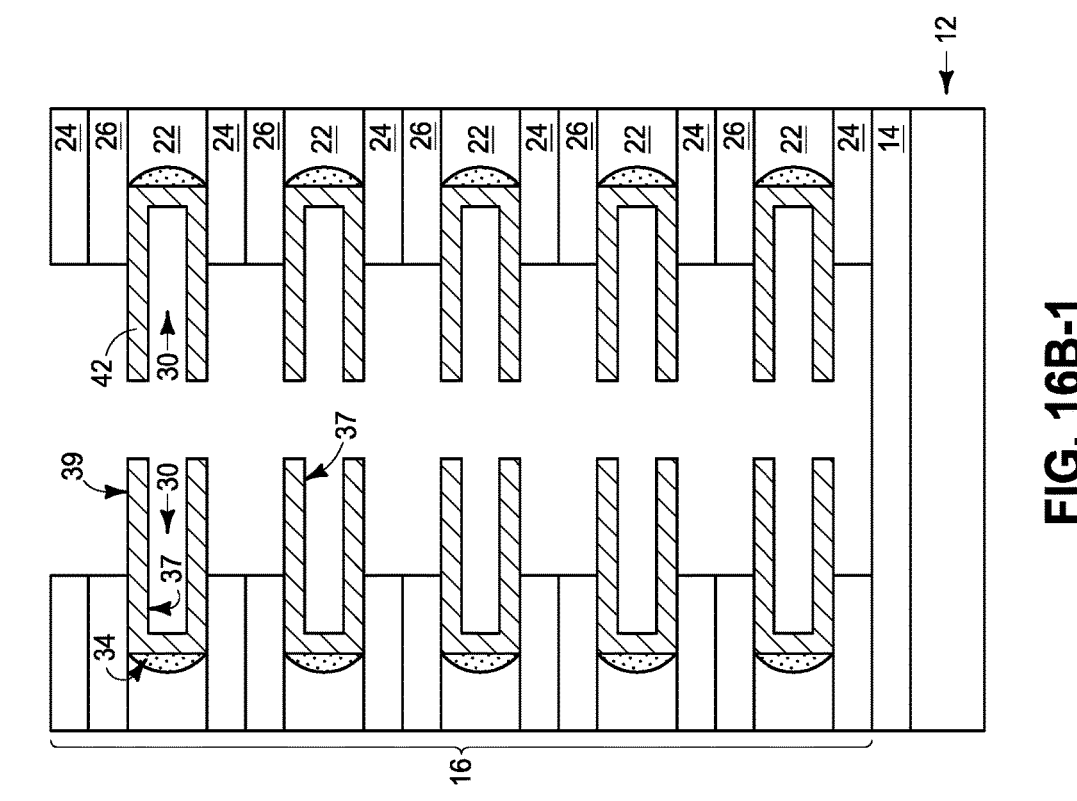
Figure 1:
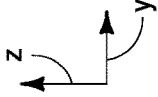

Referring to FIGS. 16-16B, the material 46 (FIGS. 15-15B) is removed from within the cavities 30 and the trench 28. The removal of the material 46 from within the cavities 30 exposes the inner surfaces 37 of the container-shaped capacitor electrodes 62.

FIG. 16B-1 shows the assembly 10 at a process stage similar to that of FIG. 16B, but following the stage describe the described above with reference to FIG. 15B-1.

Figure 17:
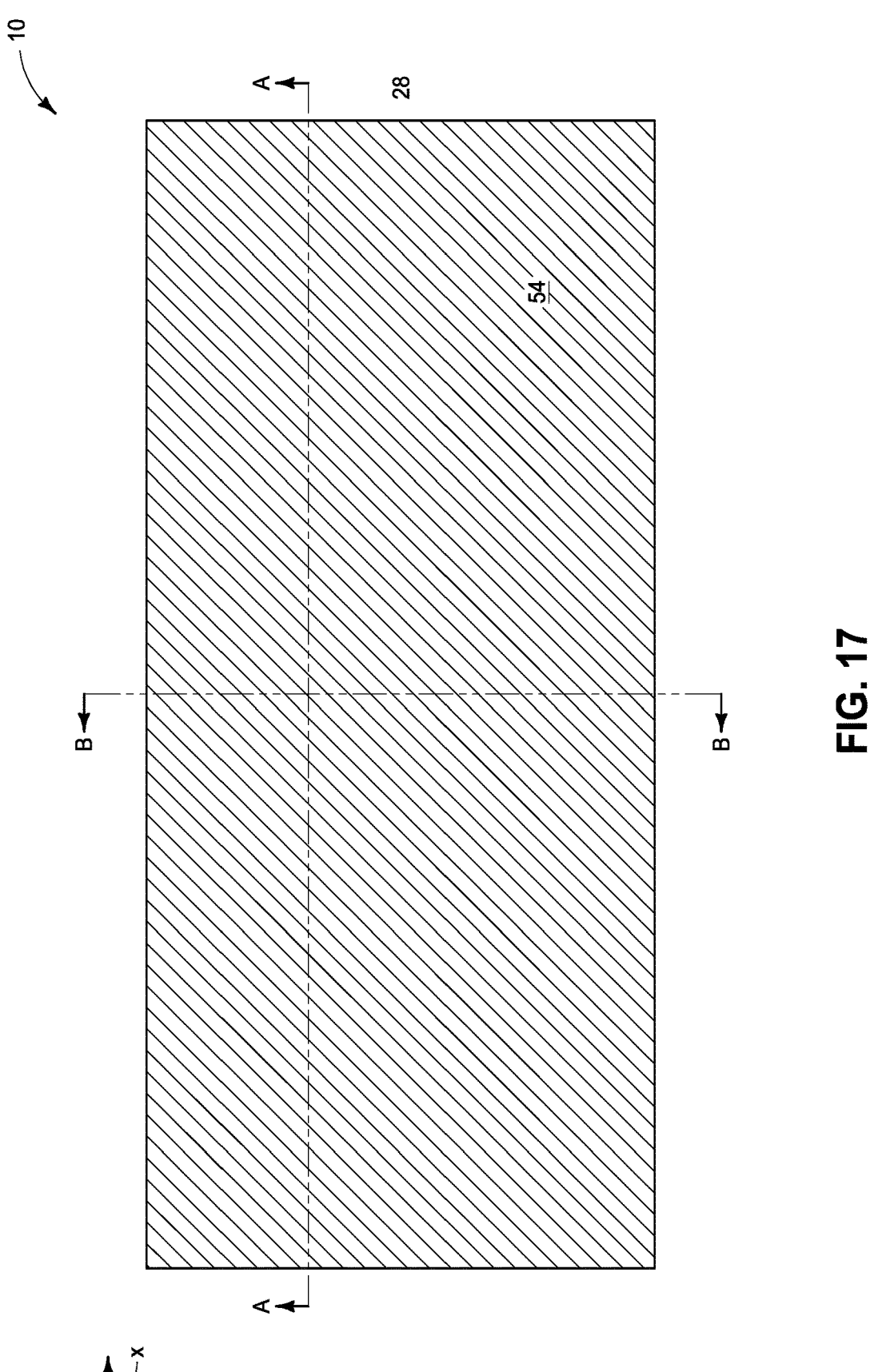
FIGS. 17-17B show the region of FIGS. 5-5B at an example process stage subsequent to that of FIGS. 16-16B.
Figure 17A:
Figure 17A:
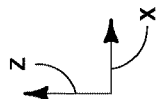
Figure 17B:
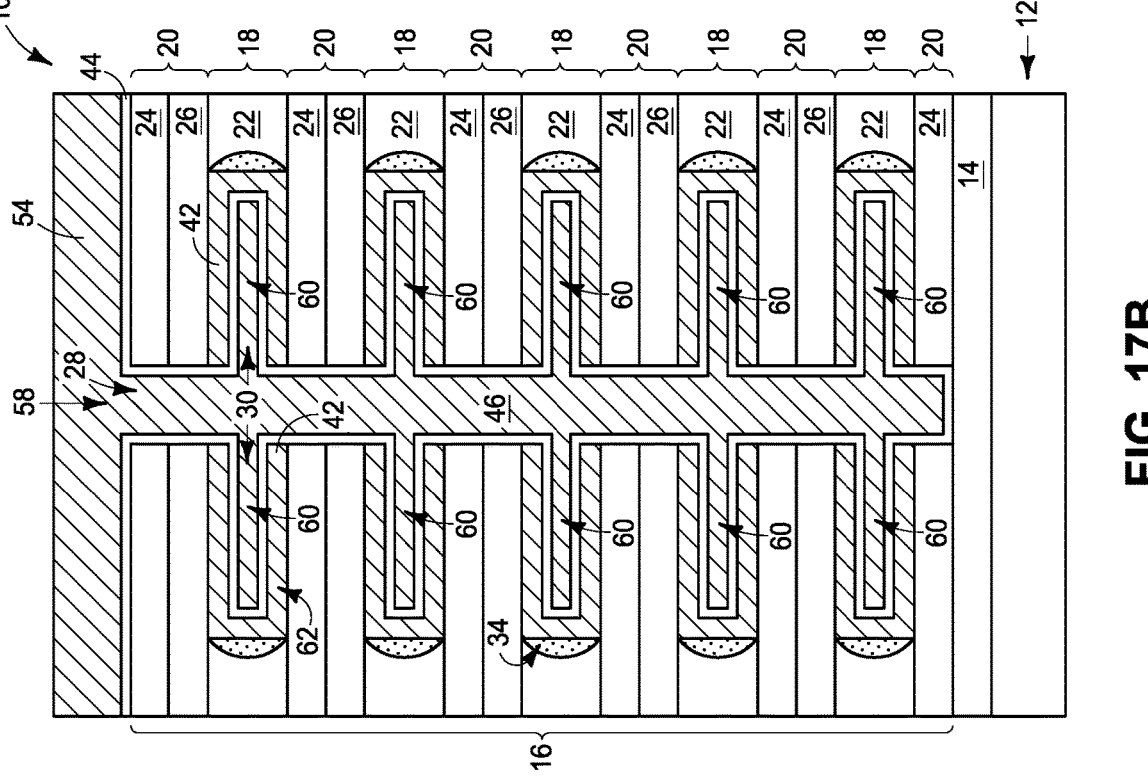
Figure 17B:
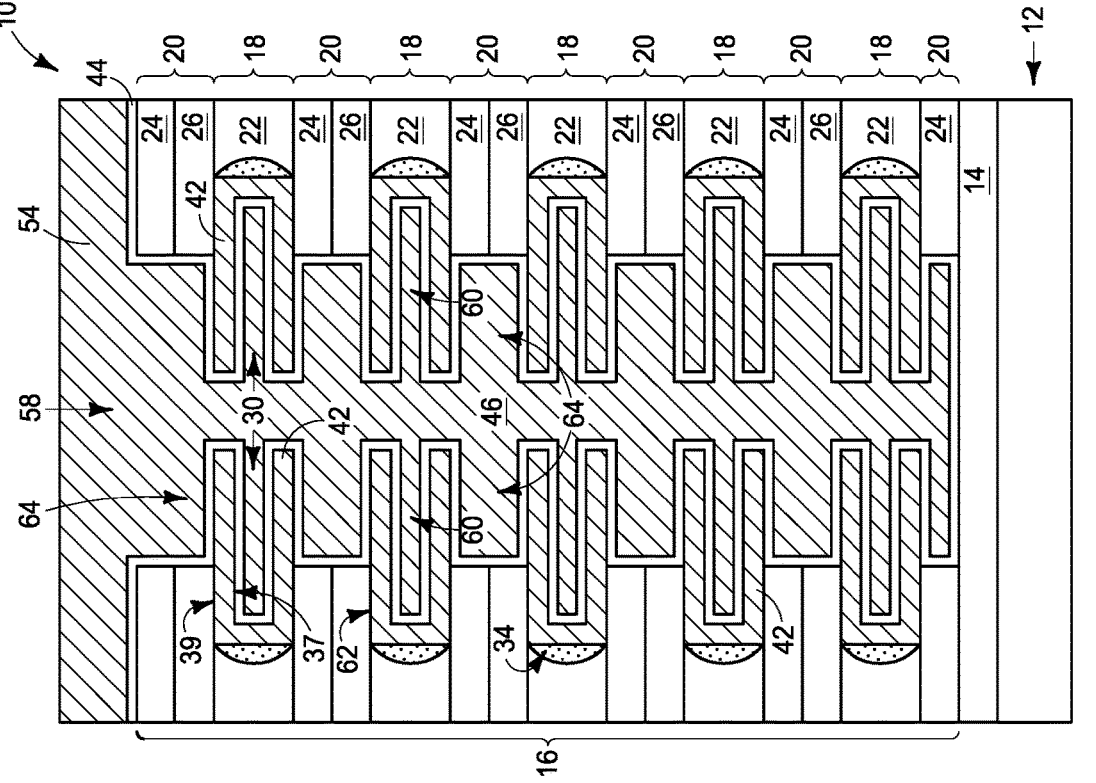
Figure 1:
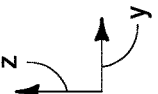

Referring to FIGS. 17-17B, capacitor dielectric material 44 is formed within the trench 28 and within the cavities 30. The capacitor dielectric material may be considered to narrow the cavities. Subsequently, second capacitor electrode material 54 is formed within the trench 28 and within the narrowed cavities 30. The second capacitor electrode material 54 fills the narrowed cavities. In the shown embodiment, the capacitor dielectric material 44 and the capacitor electrode material 54 both extend along the inner surfaces 37 and outer surfaces 39 of the container-shaped capacitor electrodes 62 (as shown in FIG. 17A), with the capacitor dielectric material 44 being between the capacitor electrode material 54 and the capacitor electrodes 62. The materials 44 and 54 extend along regions of the outer surfaces 39, but do not extend across an entirety of the outer surfaces 39 due to some regions of the outer surfaces being blocked by the dielectric materials 24 and 26, as shown in FIGS. 17A and 17B.

In some embodiments, the second capacitor electrode material 54 within the trench 28 may be considered to be configured as a column 58 which extends vertically through the stack 16 (as shown in FIG. 17B), and such column may be considered to be joined with regions 60 of the second capacitor electrode material 54 that extend laterally within the cavities 30.

The capacitor dielectric material 44 may comprise any suitable composition(s). In some embodiments, the capacitor dielectric material 44 may comprise, consist essentially of, or consist of silicon dioxide. In some embodiments, the capacitor dielectric material 44 may comprise, consist essentially of, or consist of one or more high-k compositions (e.g., aluminum oxide, zirconium oxide, hafnium oxide, etc.).

The second electrode material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the second electrode material 54 may comprise, consist essentially of, or consist of one or more metals. For instance, the second electrode material 54 may comprise, consist essentially of, or consist of one or both of titanium nitride and tungsten. The first and second electrode materials 42 and 54 may or may not be a same composition as one another.

FIG. 17B-1 shows the assembly 10 at a process stage similar to that of FIG. 17B, but following the stage describe the described above with reference to FIG. 16B-1. FIG. 17B-1 shows the column 58 of the second capacitor electrode material 54 joined with the regions 60 of the second capacitor electrode material that are along the inner surfaces 37 of the container-shaped capacitor electrodes 62, and also joined with regions 64 of the second capacitor electrode material that are along the outer surfaces 39 of the container-shaped capacitor electrodes 62.

Figure 18:
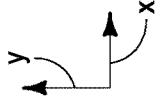
FIGS. 18-18B show the region of FIGS. 5-5B at an example process stage subsequent to that of FIGS. 17-17B.
Figure 18A:
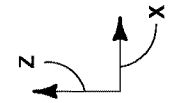
Figure 18B:
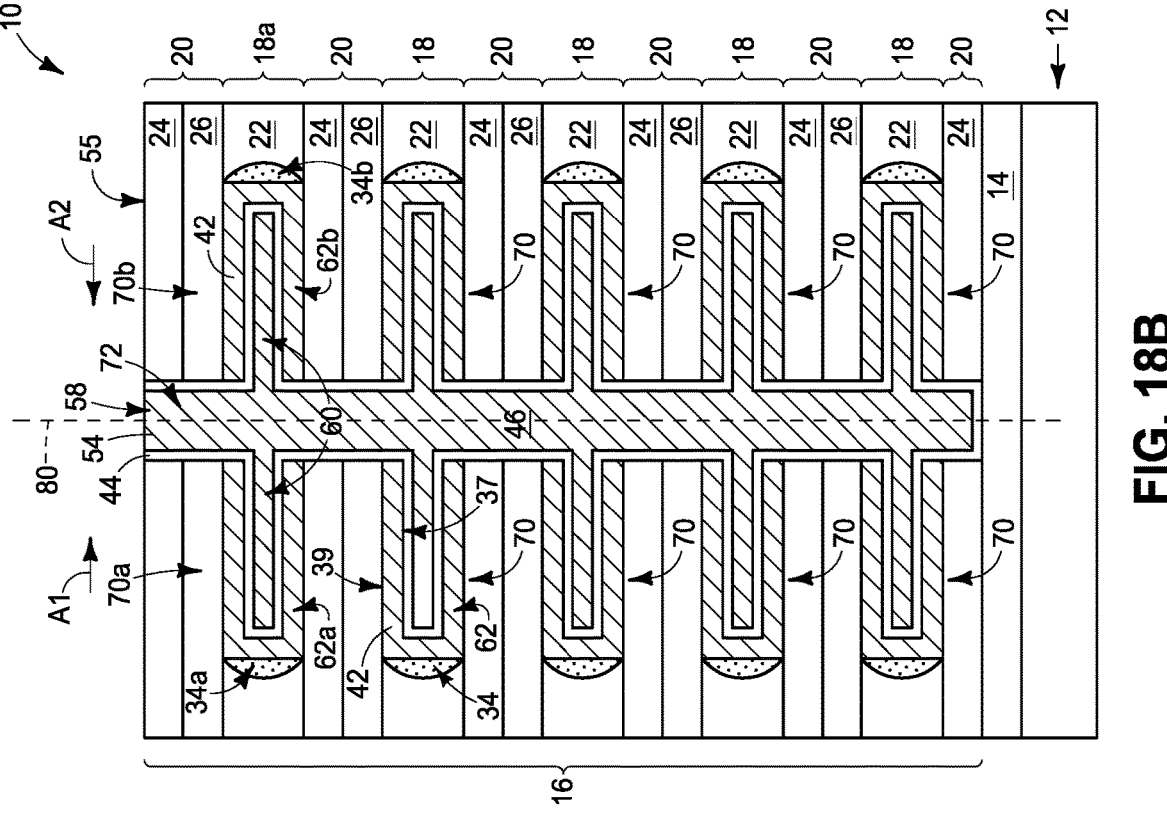
Figure 18B:
Figures 1, 18B:
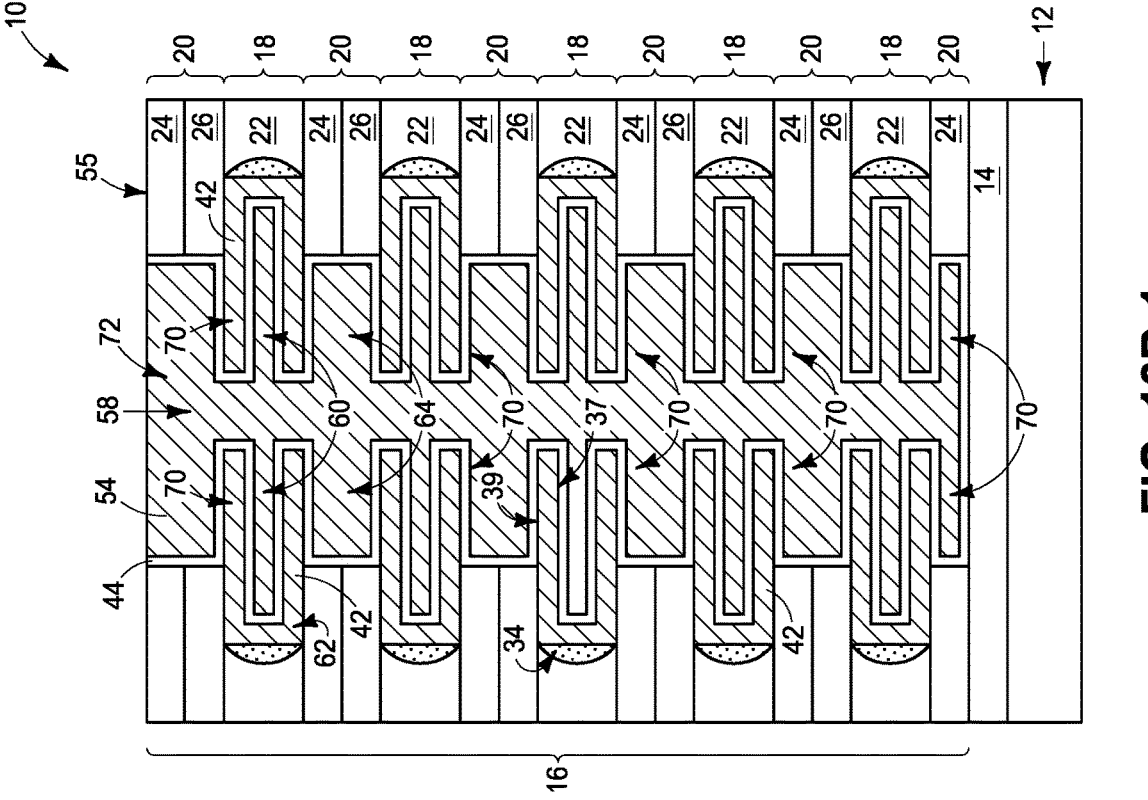

Referring to FIGS. 18-18B, a planarization process is utilized to remove excess materials 44 and 54 from over the upper surface of the stack 16, and to thereby form a planarized upper surface 55 extending across the upper surface of the stack 16. The planarization process may comprise, for example, chemical-mechanical polishing (CMP).

The configuration of FIGS. 18-18B comprises capacitors 70 along the levels 18. Each of the capacitors comprises the electrode material 42 configured as a container-shaped first electrode 62, a region of the capacitor dielectric material 44, and a region of the capacitor electrode material 54. In some embodiments, the capacitor electrode material 54 may be considered to be a shared capacitor electrode in that it is shared between laterally-adjacent capacitors within the levels 18. For instance, one of the levels 18 is labeled 18a in FIG. 18B, and such level comprises a pair of laterally-adjacent capacitors labeled 70a and 70b. The capacitors 70a and 70b comprise capacitor electrodes labeled as 62a and 62b, respectively. The capacitor electrodes 62a and 62b may be referred to as first and second capacitor electrodes, respectively. The first and second capacitor electrodes 62a and 62b are laterally-extending container-shaped electrodes. The container-shaped first electrode 62a opens along a first lateral direction A1, and the container-shaped second electrode 62b opens along a second lateral direction A2 which is opposite to the first lateral direction A1.

The capacitor dielectric material 44 lines interior surfaces of the container-shaped first and second capacitor electrodes 62a and 62b. The shared capacitor electrode material 54 extends vertically between the first and second capacitor electrodes 62a and 62b, and forms a shared capacitor electrode 72. The regions 60 of the shared capacitor electrode 72 extend into the openings of the container-shaped first and second capacitor electrodes 62a and 62b. The shared capacitor electrode 72 is spaced from the capacitor electrodes 62a and 62b by the capacitor dielectric material 44. FIG. 18A shows that the shared capacitor electrode 72 and the capacitor dielectric material 44 also extend along outer surfaces of the container-shaped electrodes, with a portion of the container-shaped electrode 62b being shown along the view of FIG. 18A.

In the illustrated embodiment, the first and second capacitors 60a and 60b are laterally offset from one another, and are substantially mirror-images of one another along a plane 80 that extends vertically through a center of the column 58 of the shared electrode 72. The term "substantial mirror-image" means a mirror-image to within reasonable tolerances of fabrication and measurement.

The source/drain regions 34 along the level 18a are labeled as 34a and 34b. The regions 34a and 34b may be referred to as first and second source/drain regions, respectively. Such first and second source/drain regions are laterally offset from one another. The container-shaped first and second capacitor electrodes 62a and 62b are coupled with the source/drain regions 34a and 34b, respectively.

In some embodiments, the capacitors 70 of FIGS. 18-18B may be incorporated into three-dimensional memory arrays of the types described above with reference to FIGS. 1-4. The capacitors maybe within memory cells of the memory array, and may be analogous to the capacitors 1208 and 1308 of FIGS. 1-4. In some embodiments, the capacitors 70 may be within memory arrays comprising vertically-extending digit lines analogous to the digit lines 1312 described with reference to FIGS. 3 and 4, and in some embodiments the capacitors 70 may be within memory arrays comprising vertically-extending wordlines analogous to the wordlines 1214 described with reference to FIGS. 1 and 2.

In some embodiments, the illustrated capacitors along each of the levels 18 may be referred to as paired capacitors in that they share a common plate electrode 72. The capacitors 70a and 70b along the level 18a (shown in FIG. 18B) may be considered to correspond to a set of the paired capacitors, and similarly the paired capacitors 70 along other levels 18 may be considered to be other sets of paired capacitors.

In some embodiments, the paired capacitors 70a and 70b may be considered together as a capacitor assembly along the level 18a. Such capacitor assembly is one of many substantially identical capacitor assemblies, with the capacitor assemblies being along the first levels 18. In some embodiments, the first levels 18 may be referred to as capacitor assembly levels (or as capacitor-containing levels). There may be any suitable number of such capacitor assembly levels within a three-dimensional memory device (e.g., a device analogous to any of the prior art devices of FIGS. 1-4). In some embodiments there may be at least eight of the capacitor assembly levels 18, at least 16 of the capacitor assembly levels 18, at least 32 of the capacitor assembly levels 18, at least 64 of the capacitor assembly levels 18, at least 128 of the capacitor assembly levels 18, at least 256 of the capacitor assembly levels 18, at least 512 of the capacitor assembly levels 18, etc.

FIG. 18B-1 shows the assembly 10 at a process stage similar to that of FIG. 18B, but following the stage described above with reference to FIG. 17B-1. FIG. 18B-1 shows the column 58 of the capacitor electrode 72 joined with the regions 60 of the second capacitor electrode material 54 that are along the inner surfaces of the container-shaped capacitor electrodes 62, and also joined with regions 64 of the second capacitor electrode material 54 that are along the outer surfaces of the container-shaped capacitor electrodes 62.

An advantage of the embodiments described herein is that the wrapping of a second capacitor electrode 72 around inner and outer edges of a laterally-extending container-shaped first capacitor electrode 62 (i.e., the illustrated double-sided capacitor configurations of FIGS. 18-18B and 18B-1) may improve capacitance as compared to conventional configurations in which the second capacitor electrode is only along inner surfaces of the laterally-extending container-shaped electrodes (i.e., single-sided capacitor configurations). It can be difficult to form double-sided capacitor configurations relative to laterally-extending container-shaped electrodes, and embodiments described herein may be utilized to address at least some of the difficulties associated with fabrication of such double-sided capacitor configurations.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a laterally-extending container-shaped first capacitor electrode and a laterally-extending container-shaped second capacitor electrode laterally offset from the first capacitor electrode. The container shape of the first capacitor electrode opens along a first lateral direction, and the container shape of the second capacitor electrode opens along a second lateral direction which is opposite to the first lateral direction. Capacitor dielectric material lines interior surfaces and exterior surfaces of the container-shaped first and second capacitor electrodes. A shared capacitor electrode extends vertically between the first and second capacitor electrodes, and extends along the lined interior and exterior surfaces of the first and second capacitor electrodes. The shared capacitor electrode, the capacitor dielectric material, and the first capacitor electrode are incorporated into a first laterally-extending capacitor. The shared capacitor electrode, the capacitor dielectric material, and the second capacitor electrode are incorporated into a second laterally-extending capacitor. The second laterally-extending capacitor is laterally offset from the first laterally-extending capacitor.

Some embodiments include an integrated assembly comprising a column of shared capacitor electrode material extending vertically through a stack of alternating first and second levels. The first levels are capacitor-containing levels and comprising paired laterally-extending capacitors. Each set of the paired capacitors includes a first capacitor and a second capacitor, with the second capacitor being substantially a mirror-image of the first capacitor along a plane which extends vertically through a center of the column of the shared electrode material. The capacitors include container-shaped electrodes which are coupled with source/drain regions associated with access devices. The shared electrode material extends along inner and outer surfaces of the container-shaped electrodes, and is spaced from the inner and outer surfaces by capacitor dielectric material. The second levels are insulative levels comprising one or more insulative materials.

Some embodiments include a method of forming an integrated assembly. A construction is formed to include a stack of alternating first levels and insulative levels. The first levels comprise semiconductor material. The construction includes insulative panels extending vertically through the stack. The insulative panels extend laterally along a first direction. A trench is formed to extend through the stack. The trench extends laterally along a second direction which crosses the first direction. The semiconductor material of the first levels is recessed to form cavities adjacent the trench. The cavities extend laterally along the first direction. Each of the cavities is between a pair of neighboring of the insulative panels. Remaining regions of the semiconductor material define lateral peripheries of the cavities distal from the trench. Source/drain regions are formed within the semiconductor material along the lateral peripheries of the cavities. First capacitor electrode material is formed within the cavities. The first electrode material is patterned into container-shaped capacitor electrodes. Regions of the container-shaped capacitor electrodes are electrically coupled with the source/drain regions. The container-shaped capacitor electrodes have inner surfaces within the container shapes, and have outer surfaces with regions along the insulative panels. At least portions of the insulative panels are removed to thereby expose the regions of the outer surfaces of container-shaped capacitor electrodes. Capacitor dielectric material is formed along the inner surfaces of the container-shaped capacitor electrodes and along the regions of the outer surfaces of the container-shaped capacitor electrodes. Second capacitor electrode material is formed adjacent to the capacitor dielectric material and along the inner surfaces of the container-shaped capacitor electrodes, as well as along the regions of the outer surfaces of the container-shaped capacitor electrodes.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   a column of shared capacitor electrode material extending vertically through a stack of alternating first and second levels;
   the first levels being capacitor-containing levels and comprising paired laterally-extending capacitors;
   each set of the paired capacitors including a first capacitor and a second capacitor, with the second capacitor being substantially a mirror-image of the first capacitor along a plane which extends vertically through a center of the column of the shared electrode material;
   each laterally-extending capacitor comprising a first electrode and a second electrode, and in a vertical cross section, each first and second electrode comprises substantially the same vertical dimension; at least one of the first and second electrodes of the capacitors including container-shaped electrodes which are coupled with source/drain regions associated with access devices;
   the shared electrode material extending along inner and outer surfaces of the container-shaped electrodes, and being spaced from the inner and outer surfaces by capacitor dielectric material;
   the second levels being insulative levels comprising one or more insulative materials; and
   wherein at least one source/drain region of each laterally-extending capacitor comprises a concave shape.

2. The integrated assembly of claim 1 wherein the container-shaped electrodes are substantially rectangular shaped.

3. The integrated assembly of claim 1 wherein the shared capacitor electrode material comprises a different composition than the container-shaped electrodes.

4. The integrated assembly of claim 1 wherein the shared capacitor electrode material comprises a same composition as the container-shaped electrodes.

5. The integrated assembly of claim 1 wherein the insulative levels comprise silicon dioxide and silicon nitride.

6. The integrated assembly of claim 1 wherein the source/drain regions comprise n-type doped silicon.

7. The integrated assembly of claim 1 wherein the capacitor dielectric material comprises silicon dioxide.

8. The integrated assembly of claim 1 wherein the capacitor dielectric material comprises one or more high-k compositions.

9. The integrated assembly of claim 1 wherein the stack comprises at least 8 of the capacitor-containing first levels.

10. The integrated assembly of claim 1 wherein the stack comprises at least 16 of the capacitor-containing first levels.

11. The integrated assembly of claim 1 wherein the stack comprises at least 32 of the capacitor-containing first levels.

12. The integrated assembly of claim 1 wherein the stack comprises at least 64 of the capacitor-containing first levels.

13. The integrated assembly of claim 1 wherein the one or more insulative materials comprise at least two insulative levels of insulative material.

14. The integrated assembly of claim 13 wherein, in a different vertical cross section, the at least two insulative levels of insulative material comprise different width dimensions relative to one another.

15. The integrated assembly of claim 1 further comprising a portion of material of the column of shared capacitor electrode material extending into the second levels between the first levels.

16. An integrated assembly, comprising:

a column of shared capacitor electrode material extending vertically through a stack of alternating first and second levels;

the first levels being capacitor-containing levels and comprising paired laterally-extending capacitors; the laterally-extending capacitors each comprise electrodes coupled with source/drain regions associated with access devices;

the second levels comprising at least two insulative levels of insulative material; and wherein each laterally-extending capacitor is coupled with source/drain regions associated with access devices; at least one source/drain region of each laterally-extending capacitor comprises a concave shape.

17. The integrated assembly of claim 16 wherein, in one vertical cross section, the at least two layers of insulative material comprise different width dimensions relative to one another.

18. The integrated assembly of claim 16 wherein each laterally-extending capacitor comprising a first electrode and a second electrode, and in a vertical cross section, each first and second electrode comprises substantially the same vertical dimension.

19. The integrated assembly of claim 16 further comprising a portion of material of the column of shared capacitor electrode material extending into the second levels between the first levels.

* * * * *